United States Patent
Son et al.

(10) Patent No.: US 9,093,479 B2
(45) Date of Patent: Jul. 28, 2015

(54) METHOD OF FORMING NONVOLATILE MEMORY DEVICE

(71) Applicant: SAMSUNG ELECTRONICS CO., LTD., Suwon-si, Gyeonggi-do (KR)

(72) Inventors: Byoungkeun Son, Hwasung (KR); Changhyun Lee, Hwasung (KR); Jaegoo Lee, Hwasung (KR); Kwang Soo Seol, Hwasung (KR); Byungkwan You, Hwasung (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/074,817

(22) Filed: Nov. 8, 2013

(65) Prior Publication Data

US 2014/0065810 A1 Mar. 6, 2014

Related U.S. Application Data

(62) Division of application No. 13/281,612, filed on Oct. 26, 2011, now Pat. No. 8,581,321.

(30) Foreign Application Priority Data

Oct. 26, 2010 (KR) .................. 10-2010-0104712

(51) Int. Cl.
*H01L 29/72* (2006.01)
*H01L 29/792* (2006.01)
*H01L 29/66* (2006.01)
*H01L 27/115* (2006.01)

(52) U.S. Cl.
CPC .... *H01L 29/66833* (2013.01); *H01L 27/11582* (2013.01); *H01L 29/7926* (2013.01)

(58) Field of Classification Search
CPC ............... H01L 27/11582; H01L 29/7926; H01L 27/11578; H01L 29/792; H01L 27/11556; H01L 27/11565
USPC .......... 438/287, 261, 588, 128; 257/330, 324, 257/326
See application file for complete search history.

(56) References Cited

U.S. PATENT DOCUMENTS

| | | | |
|---|---|---|---|
| 6,703,672 B1 | 3/2004 | Brigham et al. | |
| 7,816,727 B2 | 10/2010 | Lai et al. | |
| 7,851,849 B2 * | 12/2010 | Kiyotoshi | 257/324 |
| 7,977,733 B2 * | 7/2011 | Shiino et al. | 257/324 |
| 7,994,011 B2 * | 8/2011 | Park et al. | 438/287 |
| 8,017,993 B2 | 9/2011 | Kidoh et al. | |

(Continued)

FOREIGN PATENT DOCUMENTS

| | | |
|---|---|---|
| JP | 62-136065 A | 6/1987 |
| JP | 07-066421 A | 3/1995 |

(Continued)

*Primary Examiner* — Bradley K Smith
*Assistant Examiner* — David Goodwin
(74) *Attorney, Agent, or Firm* — Lee & Morse, P.C.

(57) ABSTRACT

A nonvolatile memory device and a method of forming the same, the device including a semiconductor substrate; a plurality of gate patterns stacked on the semiconductor substrate; inter-gate dielectric patterns between the gate patterns; active pillars sequentially penetrating the gate patterns and the inter-gate dielectric patterns to contact the semiconductor substrate; and a gate insulating layer between the active pillars and the gate patterns, wherein corners of the gate patterns adjacent to the active pillars are rounded.

9 Claims, 32 Drawing Sheets

(56) References Cited

U.S. PATENT DOCUMENTS

| | | | |
|---|---|---|---|
| 8,030,700 B2 | 10/2011 | Sakamoto | |
| 8,072,024 B2* | 12/2011 | Ishikawa et al. | 257/324 |
| 8,193,054 B2* | 6/2012 | Alsmeier | 438/216 |
| 8,193,571 B2* | 6/2012 | Katsumata et al. | 257/302 |
| 8,309,405 B2* | 11/2012 | Yang et al. | 438/156 |
| 8,330,208 B2* | 12/2012 | Alsmeier et al. | 257/321 |
| 8,643,084 B2* | 2/2014 | Shin et al. | 257/326 |
| 8,791,524 B2* | 7/2014 | Ichinose et al. | 257/324 |
| 2008/0003750 A1 | 1/2008 | Kim et al. | |
| 2008/0173928 A1 | 7/2008 | Arai et al. | |
| 2009/0283819 A1* | 11/2009 | Ishikawa et al. | 257/324 |
| 2010/0059811 A1 | 3/2010 | Sekine et al. | |
| 2010/0273870 A1 | 10/2010 | Gao et al. | |
| 2012/0012921 A1* | 1/2012 | Liu | 257/326 |
| 2012/0273870 A1* | 11/2012 | Liu | 257/324 |

FOREIGN PATENT DOCUMENTS

| | | |
|---|---|---|
| JP | 2010-067745 A | 3/2010 |
| KR | 10-0739988 B1 | 7/2007 |

* cited by examiner

METHOD OF FORMING NONVOLATILE MEMORY DEVICE

CROSS-REFERENCE TO RELATED APPLICATIONS

This is a divisional application based on pending application Ser. No. 13/281,612, filed Oct. 26, 2011, the entire contents of which is hereby incorporated by reference.

This U.S. non-provisional patent application claims priority under 35 U.S.C. §119 of Korean Patent Application No. 10-2010-0104712, filed on Oct. 26, 2010, the entire contents of which are hereby incorporated by reference.

BACKGROUND

1. Field

Embodiments relate to a nonvolatile memory device and a method of forming a nonvolatile memory device.

2. Description of the Related Art

Increasing integration of nonvolatile memory device may help satisfy superior performance and low price that users desire. The integration of semiconductor memory devices may be a very important factor determining products' price. Thus, the increased integration is particularly desirable. In a two-dimensional semiconductor memory device, the integration may be determined by an area which a unit memory cell occupies. Thus, it is greatly affected by a level of technique of forming a fine pattern. However, very expensive equipment may be used to form a fine pattern. Thus, the integration of two-dimensional semiconductor memory device may be limited.

Three-dimensional semiconductor memory devices (including memory cells three dimensionally arranged) may be used. To produce the three-dimensional semiconductor memory device in large quantities, a process technology that can realize reliable product feature while lowering manufacturing costs per bit (relative to manufacturing a two-dimensional semiconductor memory device) may be desirable.

SUMMARY

Embodiments are directed to a method of forming a semiconductor device.

The embodiments may be realized by providing a nonvolatile memory device including a semiconductor substrate; a plurality of gate patterns stacked on the semiconductor substrate; inter-gate dielectric patterns between the gate patterns; active pillars sequentially penetrating the gate patterns and the inter-gate dielectric patterns to contact the semiconductor substrate; and a gate insulating layer between the active pillars and the gate patterns, wherein corners of the gate patterns adjacent to the active pillars are rounded.

The nonvolatile memory device may further include an auxiliary insulating layer between the inter-gate dielectric pattern and the active pillar, wherein the rounded corners of the gate patterns vertically overlap the auxiliary insulating layer.

The auxiliary insulating layer may extend to be between the gate insulating layer and the gate pattern.

The auxiliary insulating layer may have a cross section of an 'L' character shape and contacts the semiconductor substrate.

A distance between the active pillar and the gate pattern at an end of center of the gate pattern may be smaller than a distance between the active pillar and the gate pattern at an end of top surface of the gate pattern.

The nonvolatile memory device may further include a first blocking insulating layer between the gate pattern and the gate insulating layer and between the gate pattern and the inter-gate dielectric pattern.

The nonvolatile memory device may further include a second blocking insulating layer interposed between the first blocking insulating layer and the gate pattern.

The active pillar may include a first semiconductor layer contacting the semiconductor substrate and a second semiconductor layer spaced apart from the semiconductor substrate while covering an outer wall of the first semiconductor layer.

The gate insulating layer may have an 'L' character shape contacting an outer wall and a bottom surface of the second semiconductor layer.

The gate insulating layer may extend to be interposed between the inter-gate dielectric pattern and the gate pattern.

The embodiments may be also be realized by providing a method of forming a nonvolatile memory device, the method including providing a semiconductor substrate; repeatedly and alternately stacking sacrificial layers and inter-gate dielectric layers on the semiconductor substrate; forming an active pillar that penetrates the inter-gate dielectric layers and the sacrificial layers to contact the semiconductor substrate; patterning the inter-gate dielectric layers and the sacrificial layers at a position spaced from the active pillar to form a first opening; removing the sacrificial layers through the first opening; and forming a gate pattern on a region where the sacrificial layers are removed, wherein a corner of the gate pattern adjacent to the active pillar is formed to be rounded.

Forming the active pillar may include patterning the inter-gate dielectric layers and the sacrificial layers to form a second opening; conformally forming an auxiliary insulating layer, a gate insulating layer and a first semiconductor layer on the semiconductor substrate where the second opening is formed; performing an anisotropic etching process on the first semiconductor layer, the gate insulating layer, and the auxiliary insulating layer to form an auxiliary insulating pattern, a gate insulating pattern, and a first semiconductor pattern covering a sidewall of the second opening; and forming a second semiconductor layer covering the semiconductor substrate exposed through the second opening and a sidewall of the first semiconductor pattern, wherein the second semiconductor layer and the first semiconductor pattern constitute the active pillar.

Removing the sacrificial layers through the first opening may include exposing the auxiliary insulating pattern using a first isotropic etching process with a first etchant, and the method may further include forming a rounded profile on the auxiliary insulating pattern by performing a second isotropic etching process with a second etchant different from the first etchant to remove an exposed part of the auxiliary insulating pattern, prior to forming the gate pattern.

Removing the exposed part of the auxiliary insulating pattern may expose a portion of the gate insulating layer.

The method may further include conformally forming a first blocking insulating layer after forming the rounded profile on the auxiliary insulating pattern.

Removing the sacrificial layers through the first opening may include forming a rounded profile on a sidewall of the inter-gate dielectric layer by removing a part of the inter-gate dielectric layer.

Removing the sacrificial layers may include performing an isotropic etching process, and the isotropic etching process may be performed using an etchant having an etching selectivity ratio such that an etch rate of the inter-gate dielectric layer to an etch rate of the sacrificial layer is about 1:5 to about 1:15.

Forming the active pillar may include forming a second opening by patterning the inter-gate dielectric layers and the sacrificial layers; forming an auxiliary insulating pattern covering a sidewall of the second opening; and forming a semiconductor layer covering a sidewall of the auxiliary insulating pattern and the semiconductor substrate in the second opening, wherein the semiconductor layer constitutes the active pillar.

Removing the sacrificial layers through the first opening may include exposing the auxiliary insulating pattern, and the method may further include forming a rounded profile on the auxiliary insulating pattern by performing an isotropic etching process to remove a part of the exposed auxiliary insulating pattern, prior to forming the gate pattern.

The embodiments may also be realized by providing a method of forming a nonvolatile memory device, the method including providing a semiconductor substrate; alternately stacking a plurality of sacrificial layers and inter-gate dielectric layers on the semiconductor substrate; forming an active pillar such that the active pillar penetrates the stacked inter-gate dielectric layers and the sacrificial layers to contact the semiconductor substrate; forming an insulating pattern between the active pillar and the stacked inter-gate dielectric layers and the sacrificial layers; patterning the inter-gate dielectric layers and the sacrificial layers at a position spaced from the active pillar to form a first opening; removing the sacrificial layers through the first opening to form inter-gate dielectric patterns; etching the insulating pattern such that indentations having rounded corners at least partially penetrate therethrough; and forming a gate pattern between the inter-gate dielectric patterns and in the indentations such that portions of the gate pattern adjacent to the active pillar have rounded corners embedded in the insulating pattern.

BRIEF DESCRIPTION OF THE DRAWINGS

The embodiments will become apparent to those of ordinary skill in the art by describing in detail exemplary embodiments with reference to the attached drawings, in which.

DETAILED DESCRIPTION

Figure 1:
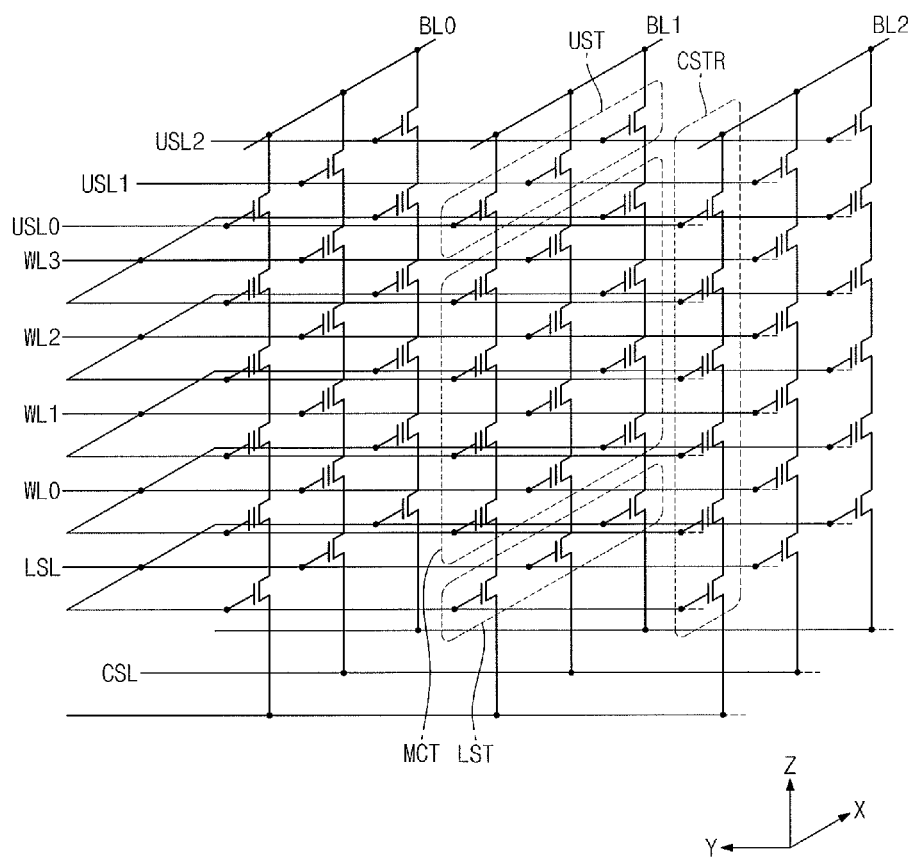
FIG. 1 illustrates a circuit diagram of a nonvolatile memory device in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. It will also be understood that when an element such as a layer, region or substrate is referred to as being "on" or "onto" another element, it may lie directly on the other element or intervening elements or layers may also be present.

Embodiments of the inventive concept may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

A nonvolatile memory device in accordance with an embodiment may include a vertical type nonvolatile memory device having a three-dimensional structure.

Figure 2:
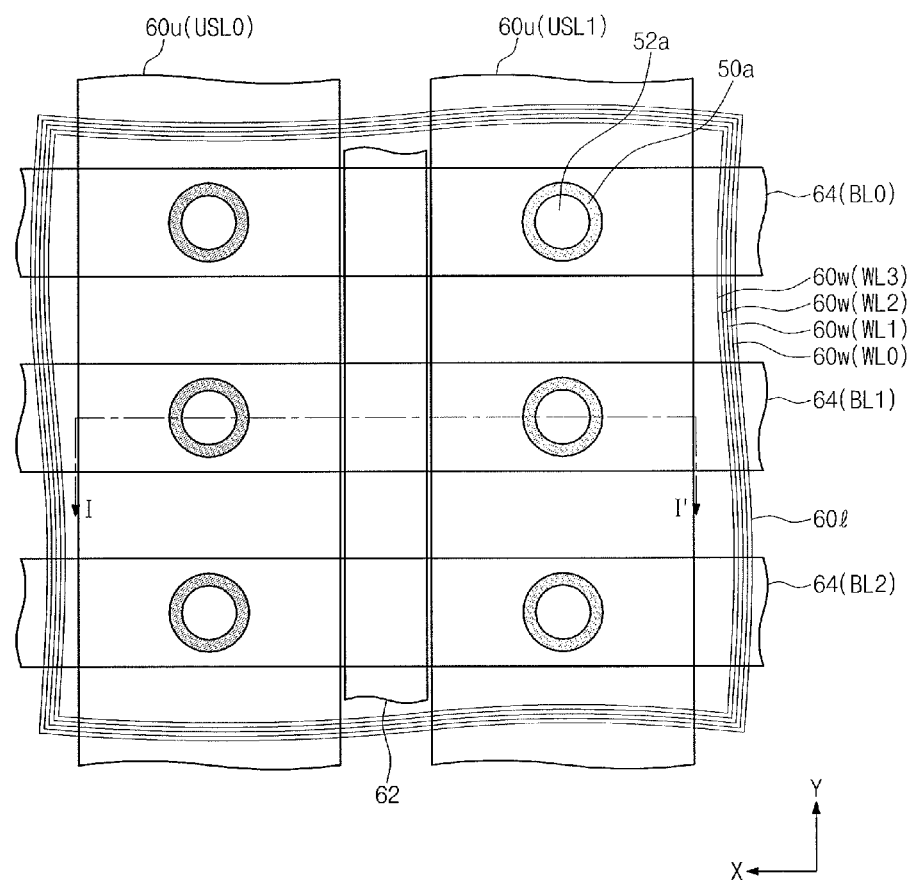
FIG. 2 illustrates a top plan view of a nonvolatile memory device in accordance with an embodiment.
Figure 3A:
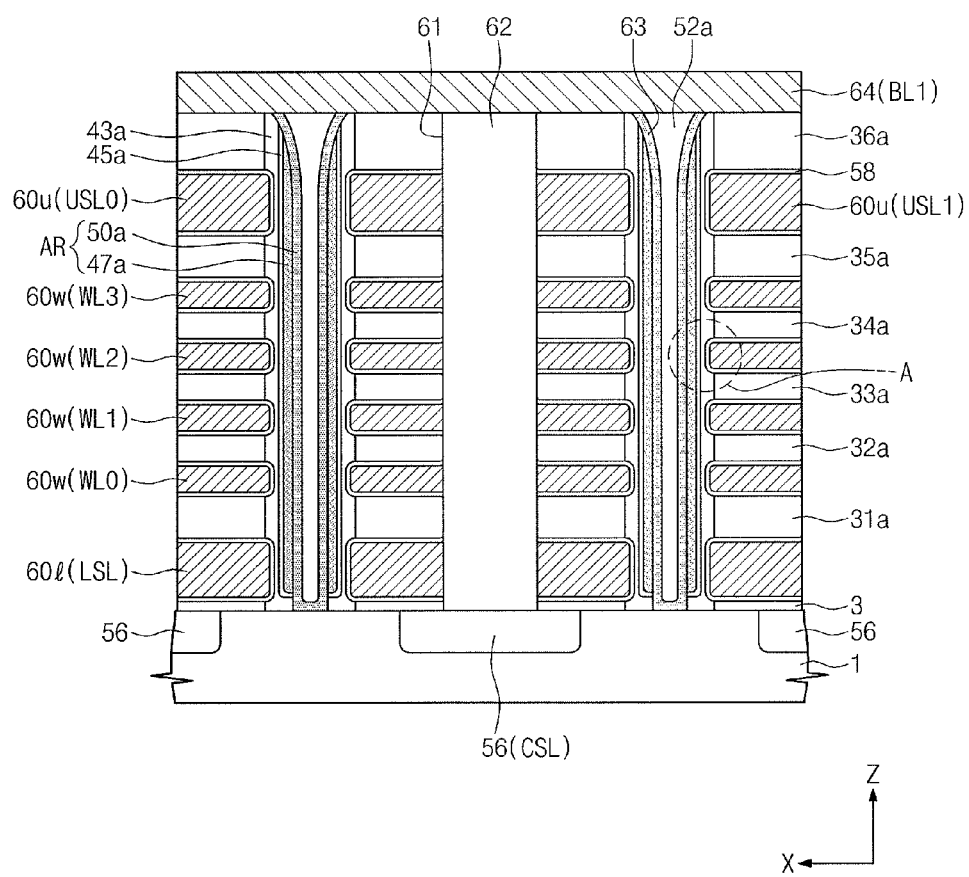
FIG. 3A illustrates a cross sectional view taken along the line I-I' of FIG. 2 showing a nonvolatile memory device according to an embodiment.

FIG. 1 illustrates a circuit diagram of a nonvolatile memory device in accordance with an embodiment. FIG. 2 illustrates a top plan view of a nonvolatile memory device in accordance with an embodiment. FIG. 3A illustrates a cross sectional view taken along the line I-I' of FIG. 2 showing a nonvolatile memory device according to an embodiment.

Referring to FIGS. 1, 2, and 3A, a vertical type semiconductor memory device in accordance with an embodiment may include a common source line CSL, a plurality of bit lines BL0~BL2, and a plurality of cell strings CSTR between the common source line CSL and the bit lines BL0~BL2.

The common source line CSL may be a conductive thin film disposed on a semiconductor substrate 1 or a first impurity implantation region 56 formed in the semiconductor substrate 1. The semiconductor substrate 1 may be a semiconductor substrate itself or an epitaxial semiconductor layer formed on the semiconductor substrate. The bit lines BL0~BL2 may be conductive lines 64 on the semiconductor substrate 1 and spaced apart from the semiconductor substrate 1. The bit lines BL0~BL2 may be two dimensionally arranged, and a plurality of cell strings CSTR may be connected to each of the bit lines BL0~BL2 in parallel. Thus, the cell strings CSTR may be two dimensionally arranged on the semiconductor substrate 1.

Each of the cell strings CSTR may include a lower select transistor LST (connected to the common source line CSL), an upper select transistor UST (connected to the bit lines BL0~BL2), and a plurality of memory cell transistors MCT (between the upper select transistor UST and the lower select transistor LST). The lower select transistor LST, the upper select transistor UST, and the memory cell transistors MCT may be connected to one another in series. A lower select line LSL, a plurality of word lines WL0~WL3, and a plurality of upper select lines USL0~USL2 (between the common source line CSL and the bit lines BL0~BL2) may be used as gate electrodes of the lower select transistors LST, gate electrodes of the memory cell transistors MCT, and gate electrodes of the upper select transistors UST, respectively. In an implementation, the lower select line LSL may be separated to be plural in number, without being connected to one another (like the upper select lines USL0~USL2).

The lower select transistors LST may be disposed at a substantially equal distance from the semiconductor substrate 1. The gate electrodes of the lower select transistors LST may be connected to the lower select line LSL in common to be in an equipotential state. Similarly, the gate electrodes of the memory cell transistors MCT (disposed at a substantially equal distance from the common source line CSL) may also be connected to one of the word lines WL0~WL3 in common to be in an equipotential state. One cell string CSTR may include a plurality of memory cell transistors MCT disposed at a different distance from the common source line CSL. Thus, multilayer word lines WL0~WL3 may be disposed between the common source line CSL and the bit lines BL0~BL2.

The cell strings CSTR may each include an active pillar AR vertically extending from the semiconductor substrate 1 to be connected to the bit lines BL0~BL2. The active pillar AR may penetrate the upper select lines USL0~USL2, the lower select line LSL, and the word lines WL0~WL3.

A gate insulating layer pattern 45a may be between the word lines WL0~WL3 and the active pillar AR. According to the present embodiment, the gate insulating layer pattern 45a may include a tunnel insulating layer and a charge trap layer. In an implementation, the charge trap layer may not be included between the lower select line LSL and the active pillar AR and between the upper select lines USL0~USL2 and the active pillar AR.

The lower and upper select transistors LST and UST and the memory cell transistors MCT may be a MOSFET using the active pillar AR as a channel region.

Referring to FIGS. 2 and 3A, gate patterns 60l, 60w, and 60u and inter-gate dielectric patterns 31a, 32a, 33a, 34a, 35a, and 36a may be repeatedly and alternately stacked. The semiconductor substrate 1 may have an upper plane extending along a first direction X. A second direction Y may cross the first direction X at a right angle. The gate patterns 60l, 60w, and 60u and inter-gate dielectric patterns 31a, 32a, 33a, 34a, 35a, and 36a may be stacked on the upper plane in a third direction Z crossing the first and second directions X and Y at a right angle. Although not illustrated in the figures, a well region may be formed in the semiconductor substrate 1. A p-type impurity layer may be formed in the semiconductor substrate 1.

In a predetermined region in the semiconductor substrate 1, the first impurity implantation region 56 may be disposed in line form extending in the second direction Y. The first impurity implantation region 56 may be an $N^+$ type impurity layer. A plurality of the first impurity implantation regions 56 may be connected to one another in a predetermined region. The first impurity implantation region 56 may be disposed at a position overlapping or corresponding to the gate patterns 60l, 60w, and 60u. For example, portions of the first impurity implantation region 56 may underlie portions of the gate patterns 60l, 60w, and 60u.

The gate patterns 60l, 60w, and 60u may include, e.g., polysilicon doped with an impurity and/or a metal containing layer such as metal, a metal nitride, and/or a metal silicide. For example, the gate patterns 60l, 60w, and 60u may include polysilicon, tungsten, a tantalum nitride layer, a titanium nitride layer, and/or a metal silicide. The gate patterns 60l, 60w, and 60u may include a lower select gate pattern 60l, a word line gate pattern 60w, and an upper select gate pattern 60u.

The active pillar AR may penetrate the gate patterns 60l, 60w, and 60u and the inter-gate dielectric patterns 31a, 32a, 33a, 34a, 35a, and 36a to contact the semiconductor substrate 1. The active pillar AR may include a first semiconductor pattern 47a and a second semiconductor pattern 50a. The second semiconductor pattern 50a may cover an inner wall of the first semiconductor pattern 47a and the semiconductor substrate 1, e.g., a portion of a top surface of the semiconductor substrate 1. The active pillar AR may be spaced apart from the first impurity implantation region 56. The active pillar AR may include, e.g., polysilicon doped with an impurity or undoped polysilicon. In the present embodiment, the active pillar AR may have a cup shape. An interior of the active pillar AR may be filled with an internal insulating pattern 52a. The gate insulating layer pattern 45a may be interposed between the gate patterns 60l, 60w, and 60u and the active pillar AR. The gate insulating layer pattern 45a may cover an outer wall and a bottom surface of the first semiconductor pattern 47a. For example, the gate insulating layer pattern 45a may have a roughly 'L'-like shape. An auxiliary insulating pattern 43a may be interposed between the gate insulating layer pattern 45a and the inter-gate dielectric patterns 31a, 32a, 33a, 34a, 35a, and 36a. The auxiliary insulating pattern 43a may also extend between the gate patterns 60*l*, 60*w*, and 60*u* and the active pillar AR. The auxiliary insulating pattern 43*a* may include, e.g., an oxide layer system. The auxiliary insulating pattern 43*a* interposed between the gate patterns 60*l*, 60*w*, and 60*u* and the active pillar AR may perform a function of a blocking insulating layer.

Figure 3B:
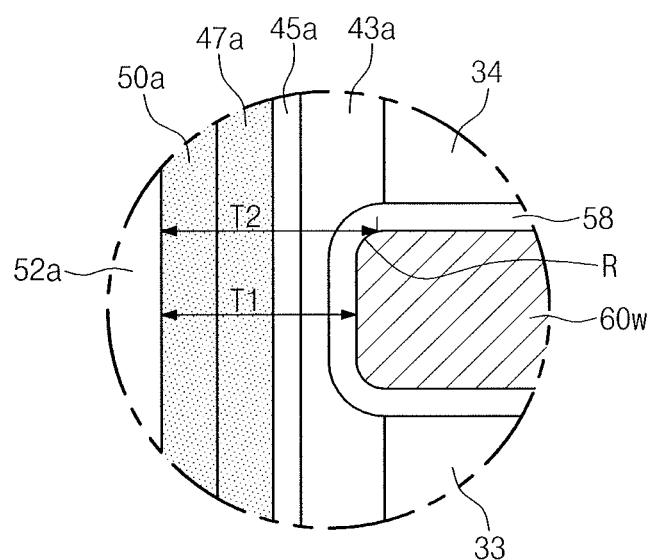
FIG. 3B illustrates an enlarged view of 'A' part of FIG. 3A.

FIG. 3B illustrates an enlarged view of 'A' part of FIG. 3A.

Referring to FIGS. 2, 3A, and 3B, a blocking (gate) insulating layer 58 may be interposed between the gate patterns 60*l*, 60*w*, and 60*u* and the auxiliary insulating pattern 43*a* and between the inter-gate dielectric patterns 31*a*, 32*a*, 33*a*, 34*a*, 35*a*, and 36*a* and the gate patterns 60*l*, 60*w*, and 60*u*. The blocking insulating layer 58 may include a high dielectric layer, e.g., an aluminum oxide layer or other material having a dielectric constant higher than a silicon oxide layer. Forming the blocking insulating layer 58 of a high dielectric layer may help improve a program/erase speed of a device.

Referring to FIG. 3B, corners of the gate patterns 60*l*, 60*w*, and 60*u* adjacent to the first semiconductor pattern 47*a* of the active pillar AR may be rounded. For example, a distance T1 between the internal insulating pattern 52*a* and an end of centers of each of the gate patterns 60*l*, 60*w*, and 60*u* may be smaller than a distance T2 between the internal insulating pattern 52*a* and an end of a top surface of each of the gate patterns 60*l*, 60*w*, and 60*u*. In an implementation, a distance between the internal insulating pattern 52*a* and an outer edge of the auxiliary insulting pattern 43*a* may be greater than a distance between the internal insulating pattern 52*a* and the rounded corners of the gate patterns 60*l*, 60*w*, and 60*u*, e.g., T2. For example, the rounded corners of the gate patterns 60*l*, 60*w*, and 60*u* may vertically overlap the auxiliary insulating pattern 43*a*. In an implementation, the rounded corners of ends of the gate patterns 60*l*, 60*w*, and 60*u* may penetrate to be embedded in the auxiliary insulating pattern 43*a*, e.g., the rounded corners may be completely encompassed by the auxiliary insulating pattern 43*a*. Thus, when a device operates, an electric field may be prevented from concentrating at the corners of the gate patterns 60*l*, 60*w*, and 60*u*. As a result, deterioration of the gate insulating layer pattern 45*a* may be reduced or prevented, and reliability of the gate insulating layer pattern 45*a* may be improved. Also, an undesirable back tunneling phenomenon (that may otherwise occur when an erasure operation is performed) may be reduced.

A buried insulating pattern 62 (penetrating the gate patterns 60*l*, 60*w*, and 60*u* and the inter-gate dielectric patterns 31*a*, 32*a*, 33*a*, 34*a*, 35*a*, and 36*a*) may be disposed between a plurality of the active pillars AR. In an implementation, the buried insulating pattern 62 may not penetrate the lower select gate pattern 60*l*. The buried insulating pattern 62 may have a line shape extending in the second direction Y. The upper select gate pattern 60*u* may be divided into a plurality of line shapes (extending in the second direction Y on one plane) by the buried insulating pattern 62. The word line gate pattern 60*w* may also be divided into a plurality of line shapes (extending in the second direction Y on one plane) by the buried insulating pattern 62. However, the lines of the adjacent plurality of word line gate patterns 60*w* divided on one plane may be connected to one another in a predetermined region not illustrated in FIGS. 2 and 3A. For example, the buried insulating pattern 62 may not entirely isolate the plurality of word line gate patterns 60*w* from one another. Thus, the word line gate patterns 60*w* (located on one plane (X-Z plane)) may be connected in common as illustrated in the circuit diagram of FIG. 1.

A second impurity implantation region 63 may be disposed on an upper portion of the active pillar AR. The second impurity implantation region 63 may be doped with a same type of impurity as the first impurity implantation region 56. The second impurity implantation region 63 may perform a function of a drain. The inter-gate dielectric patterns 31*a*, 32*a*, 33*a*, 34*a*, 35*a*, and 36*a* may include first through sixth inter-gate dielectric patterns 31*a*, 32*a*, 33*a*, 34*a*, 35*a*, and 36*a* that are sequentially stacked from underneath, e.g., upwardly along the third direction X from a lower portion of FIG. 3A. A conductive line 64 (extending in the first direction X and contacting the second impurity implantation region 63) may be disposed on the uppermost sixth inter-gate dielectric pattern 36*a*. The conductive line 64 may correspond to the bit line BL0~BL2. A buffer layer 3 may be disposed between the lower select gate pattern 60*l* and the semiconductor substrate 1. The blocking insulating layer 58 may be interposed between the buffer layer 3 and the lower select gate pattern 60*l*.

Hereinafter, a method of forming a nonvolatile memory device having a cross section of FIG. 3A will be described with reference to FIGS. 4 through 13. FIGS. 4 through 13 illustrate cross sectional views of stages in a process of forming a nonvolatile memory device having a cross section of FIG. 3A.

Figure 4:
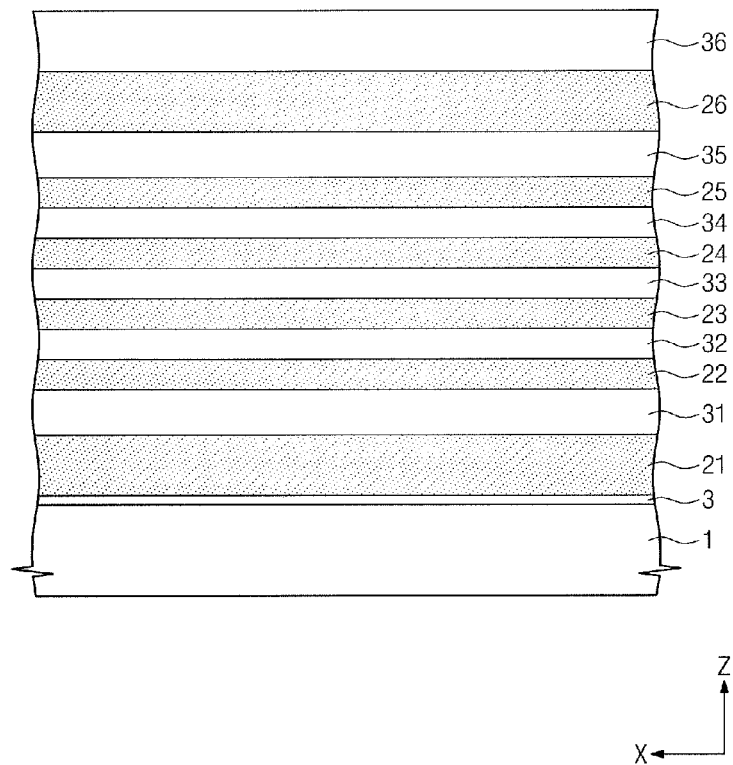
FIGS. 4 through 13 illustrate cross sectional views of stages in a process of forming a nonvolatile memory device having a cross section of FIG. 3A.

Referring to FIG. 4, a buffer layer 3 may be formed on a semiconductor substrate 1. The buffer layer 3 may be formed of a silicon oxide layer system. Sacrificial layers 21, 22, 23, 24, 25, and 26 and inter-gate dielectric layers 31, 32, 33, 34, 35, and 36 may be alternately stacked on the buffer layer 3. The sacrificial layers 21, 22, 23, 24, 25, and 26 may include first through sixth sacrificial layers 21, 22, 23, 24, 25, and 26 that are sequentially stacked from underneath, e.g., upwardly along the third direction Z from a lower portion of FIG. 4. The inter-gate dielectric layers 31, 32, 33, 34, 35, and 36 may include first through sixth inter-gate dielectric layers 31, 32, 33, 34, 35, and 36 that are sequentially stacked from underneath, e.g., from a lower portion of FIG. 4. The sacrificial layers 21, 22, 23, 24, 25, and 26 may include material having an etching selectivity with respect to the inter-gate dielectric layers 31, 32, 33, 34, 35, and 36. For example, the inter-gate dielectric layers 31, 32, 33, 34, 35, and 36 may be formed of a silicon oxide layer system, and the sacrificial layers 21, 22, 23, 24, 25, and 26 may formed of a silicon nitride layer system or a silicon germanium layer system.

Figure 5:
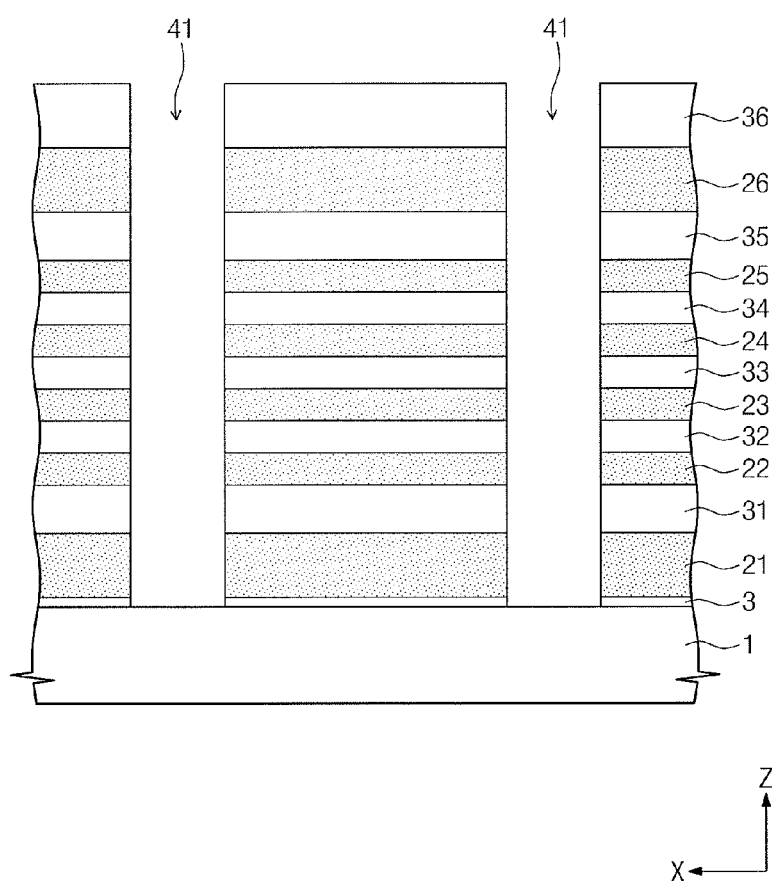

Referring to FIG. 5, the inter-gate dielectric layers 31, 32, 33, 34, 35, and 36, the sacrificial layers 21, 22, 23, 24, 25, and 26, and the buffer layer 3 may be anisotropically etched to form a plurality of first openings 41 exposing the semiconductor substrate 1. In an implementation, the first opening 41 may have a hole shape.

Figure 6:
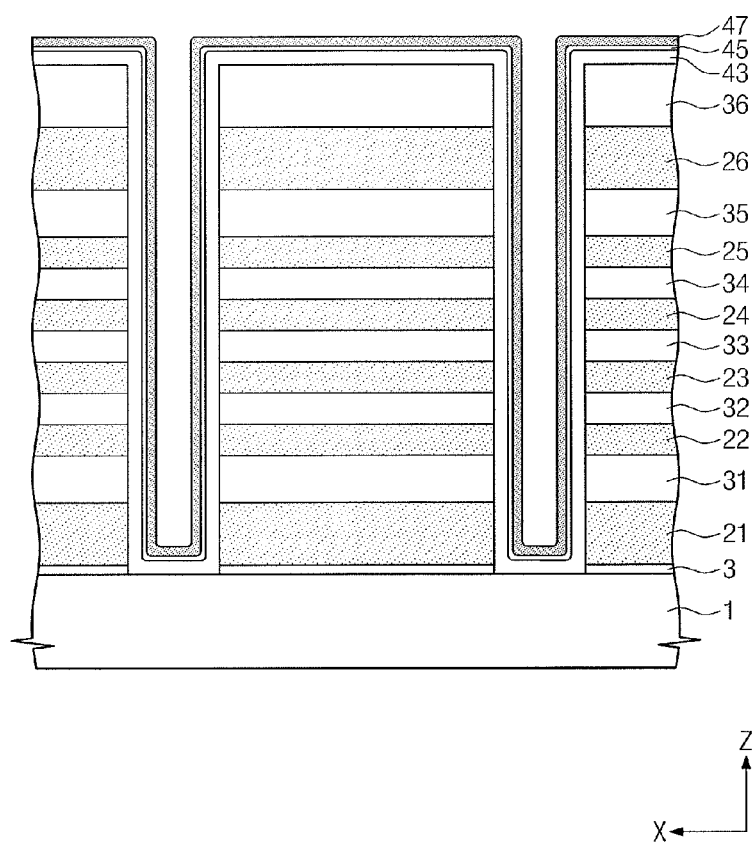

Referring to FIG. 6, an auxiliary insulating layer 43, a gate insulating layer 45, and a first semiconductor layer 47 may be sequentially and conformally formed on the semiconductor substrate 1 including the first opening 41. The auxiliary insulating layer 43 may be formed of a silicon oxide layer system. The material of the auxiliary insulating layer 43 may be the same as the material used for the inter-gate dielectric layers 31, 32, 33, 34, 35, and 36. The gate insulating layer 45 may be formed by forming a tunnel insulating layer and a charge trap layer. The tunnel insulating layer may include a material having a band gap greater than a band gap of the charge trap layer and may be formed using, e.g., chemical vapor deposition or an atomic layer deposition. For example, the tunnel insulating layer may include a silicon oxide layer formed using chemical vapor deposition or an atomic layer deposition. In addition, the tunnel insulating layer may further undergo a predetermined thermal treatment process after the deposition process. The thermal treatment process may include an annealing process performed in an atmosphere including a rapid thermal nitridation (RTN) or one of oxygen and nitrogen. The charge trap layer may be formed of at least one of a silicon nitride layer, a silicon oxynitride layer, a silicon rich nitride layer, a nanocrystalline layer, and a laminated trap layer. The first semiconductor layer 47 may be formed of a polysilicon layer not doped with an impurity. The first semiconductor layer 47 may cover the gate insulating layer 45 and may prevent or reduce damage to the gate insulating layer 45 during a subsequent etching process and may protect the gate insulating layer 45.

Figure 7:
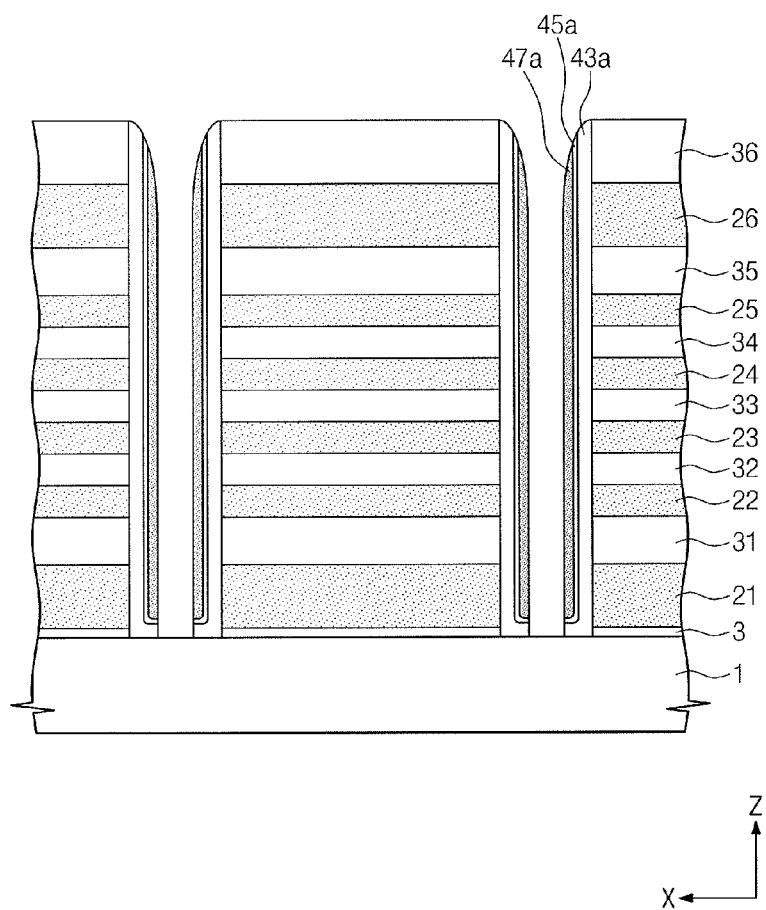

Referring to FIG. 7, an anisotropic etching process may be performed on the first semiconductor layer 47, the gate insulating layer 45, and the auxiliary insulating layer 43 to expose a top surface of the sixth inter-gate dielectric layer 36, to expose a top surface of the semiconductor substrate 1 in the first opening 41, and to form an auxiliary insulating pattern 43a, a gate insulating layer pattern 45a, and a first semiconductor pattern 47a covering an inner wall of the first opening 41. The auxiliary insulating pattern 43a and the gate insulating layer pattern 45a may be formed to each have a roughly 'L'-like shape.

Figure 8:
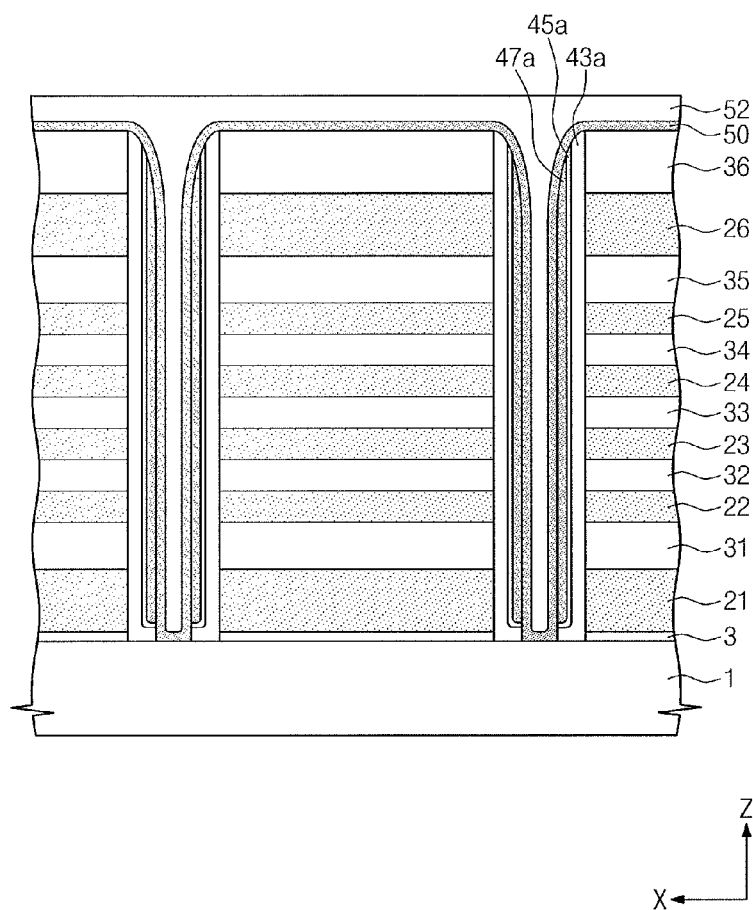

Referring to FIG. 8, a second semiconductor layer 50 may be conformally formed on an entire surface of the semiconductor surface 1 including the auxiliary insulating pattern 43a, the gate insulating layer pattern 45a, and the first semiconductor pattern 47a. The second semiconductor layer 50 may cover an exposed portion of the top surface of the semiconductor substrate 1 in the first opening 41. The second semiconductor layer 50 may be formed of a polysilicon layer not doped with an impurity. The second semiconductor layer 50 may be formed using a chemical vapor deposition process or an atomic layer deposition process. The second semiconductor layer 50 may not completely fill the first opening 41. Subsequently, an internal insulating layer 52 may be formed to fill the first opening 41. The internal insulating layer 52 may be formed of, e.g., a silicon oxide layer system.

Figure 9:
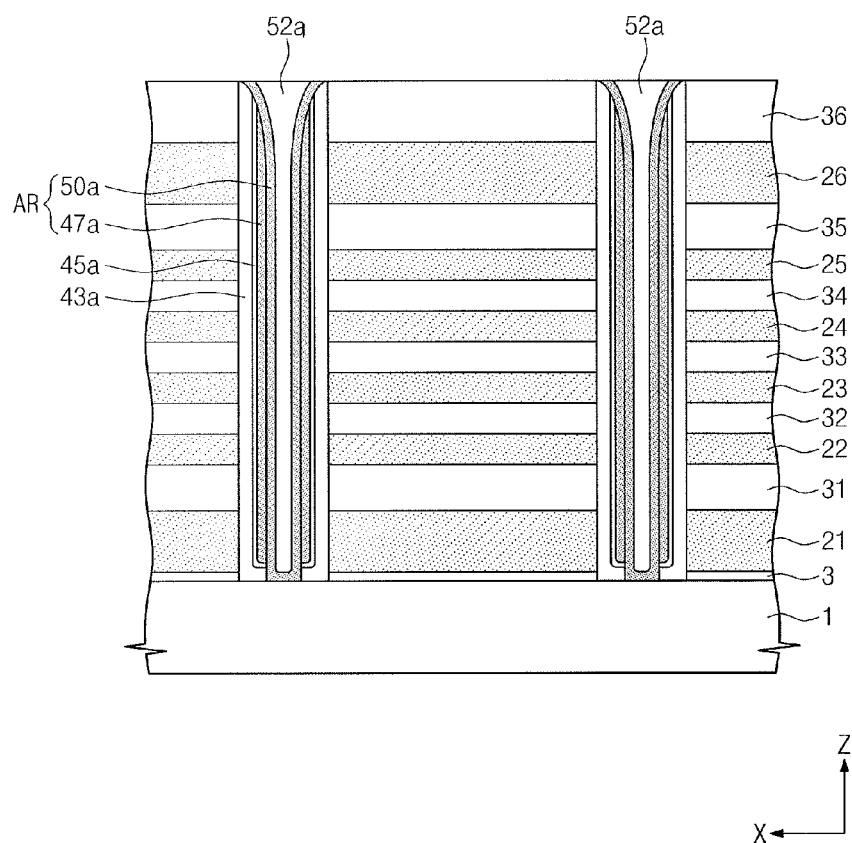

Referring to FIG. 9, a planarization etching process may be performed to expose a top surface of the sixth inter-gate dielectric layer 36 by removing portions of the second semiconductor layer 50 and the internal insulating layer 52 on the sixth inter-gate dielectric layer 36, thereby forming a second semiconductor pattern 50a and an internal insulating pattern 52a in the first opening 41. Thus, an active pillar AR including the first semiconductor pattern 47a and the second semiconductor pattern 50a may be formed.

Figure 10:
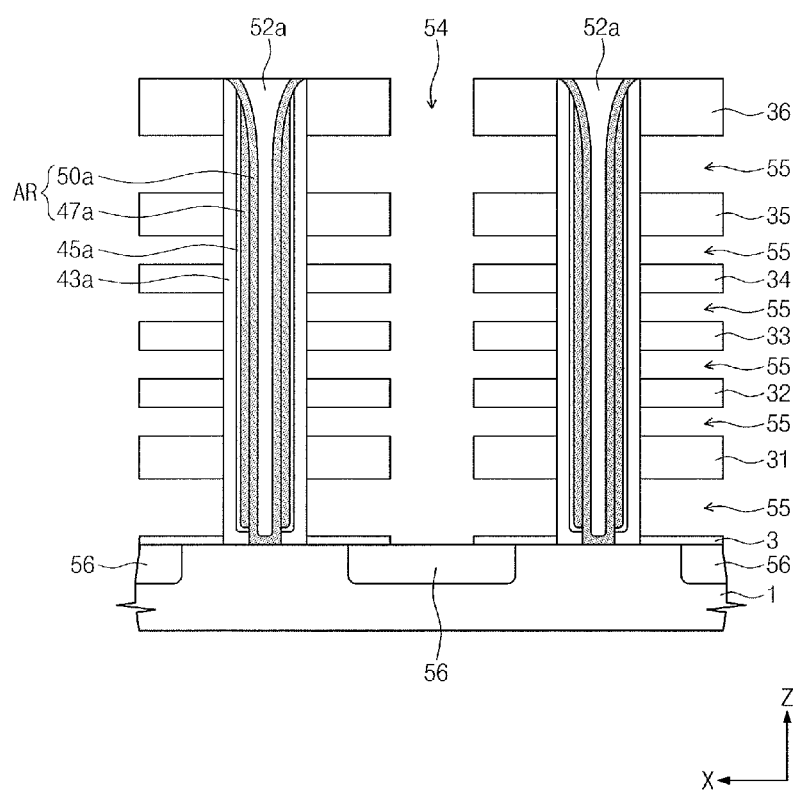

Referring to FIGS. 9 and 10, an anisotropic etching process may be successively performed on the inter-gate dielectric layers 31, 32, 33, 34, 35, and 36, the sacrificial layers 21, 22, 23, 24, 25, and 26, and portions of the buffer layer 3 between adjacent active pillars AR to form a second opening 54 exposing a top surface of the semiconductor substrate 1. The second opening 54 may be formed to have a line shape on a plane formed by the first direction X and the second direction Y. A first impurity implantation region 56 may be formed in portions of the semiconductor substrate 1 exposed through the second opening 54 by performing an ion implantation process.

The sacrificial layers 21, 22, 23, 24, 25, and 26 exposed through the second opening 54 may be selectively removed. The sacrificial layers 21, 22, 23, 24, 25, and 26 may be removed by a first isotropic etching process. The isotropic etching process may be performed using a first etching recipe or etchant having an etching selectivity ratio such that an etch rate of the inter-gate dielectric layer (reference number: 31, 32, 33, 34, 35 and 36) to an etch rate of the sacrificial layer (reference number: 21, 22, 23, 24, 25 and 26) is about 1:30.

The sacrificial layers 21, 22, 23, 24, 25, and 26 may be selectively removed, thereby forming a gate formation region 55 that exposes a sidewall of the auxiliary insulating pattern 43a in a place where the sacrificial layers 21, 22, 23, 24, 25, and 26 were, e.g., prior to being removed. The gate formation region 55 may expose top surfaces and bottom surfaces of the inter-gate dielectric layers 31, 32, 33, 34, 35, and 36.

Figure 11:
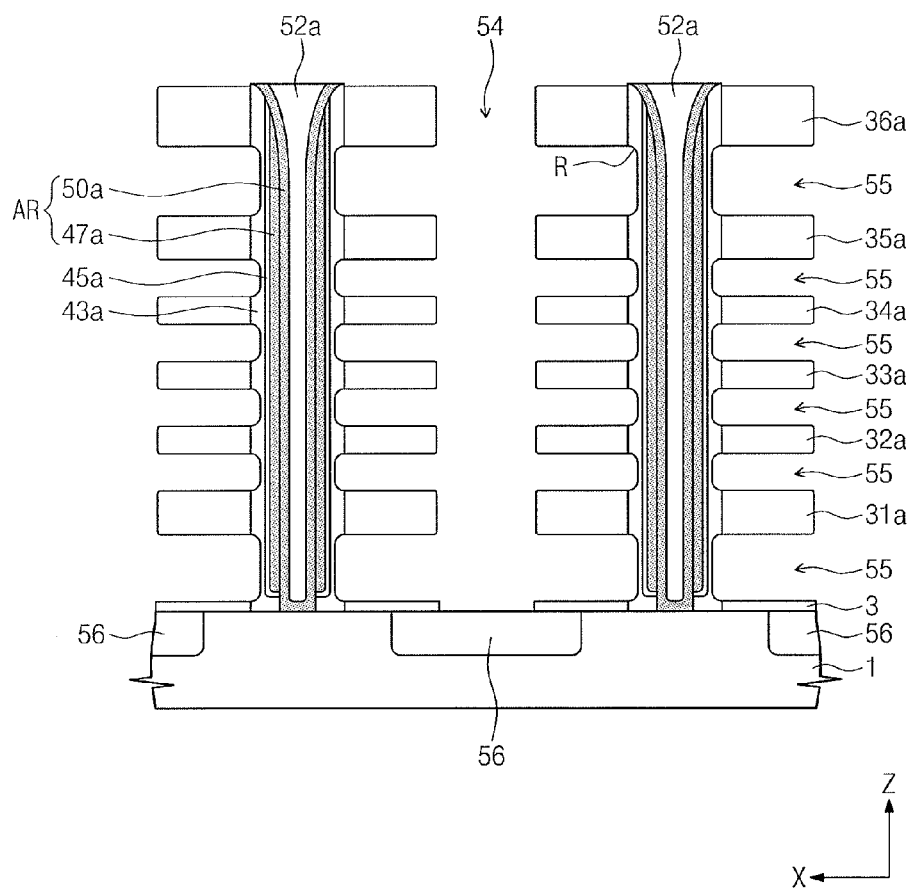

Referring to FIG. 11, another, e.g., second, isotropic etching process may be performed to remove an exposed portion of the auxiliary insulating pattern 43a. A second etching gas or etchant (different from the first etchant) may readily contact portions of the auxiliary insulating pattern 43a further from ends of the inter-gate dielectric layers 31, 32, 33, 34, 35, and 36. Thus, the portions of the auxiliary insulating pattern 43a further from ends of the inter-gate dielectric layers 31, 32, 33, 34, 35, and 36 may be well etched. The second etching gas or etchant may be prevented from readily contacting portions of the auxiliary insulating pattern 43a closer or adjacent to ends of the inter-gate dielectric layers 31, 32, 33, 34, 35, and 36. Thus, portions of the auxiliary insulating pattern 43a closer or adjacent to ends of the inter-gate dielectric layers 31, 32, 33, 34, 35, and 36 the auxiliary insulating pattern 43a may be etched to a lesser degree. Thus, a rounded profile R may be formed on a sidewall of the auxiliary insulating pattern 43a. For example, the auxiliary insulating pattern 43a may be etched such that indentations having rounded corners at least partially penetrate therethrough. If the auxiliary insulating pattern 43a is formed of the same material as the inter-gate dielectric layers 31, 32, 33, 34, 35, and 36, exposed parts of the inter-gate dielectric layers 31, 32, 33, 34, 35, and 36 may be removed where the auxiliary insulating pattern 43a is etched. The etching may form inter-gate dielectric patterns 31a, 32a, 33a, 34a, 35a, and 36a. The inter-gate dielectric patterns 31a, 32a, 33a, 34a, 35a, and 36a may include first through sixth inter-gate dielectric patterns 31a, 32a, 33a, 34a, 35a, and 36a, e.g., stacked in the third direction from a bottom region of FIG. 11. In the present embodiment, the gate insulating layer pattern 45a may not be exposed by the isotropic etching process. For example, the auxiliary insulating pattern 43a may protect the gate insulating layer pattern 45a from the isotropic etching process.

Figure 12:
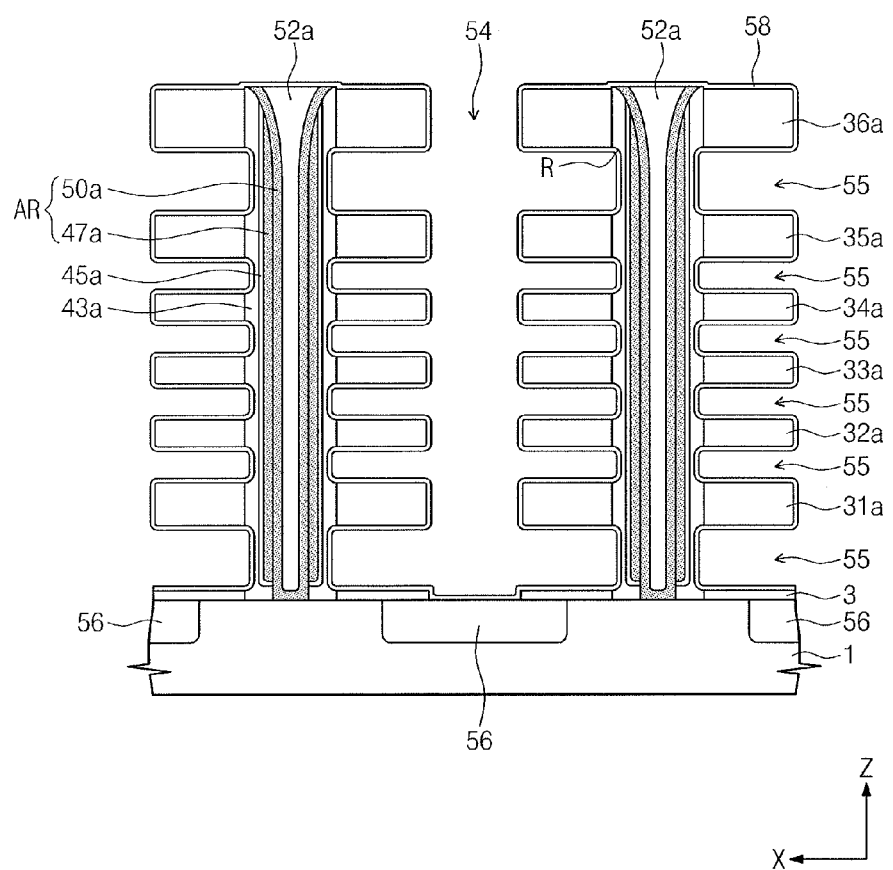

Referring to FIG. 12, a blocking insulating layer 58 may be conformally formed. The blocking insulating layer 58 may be formed of a silicon oxide layer or a high dielectric layer, e.g., an aluminum oxide layer. The blocking insulating layer 58 may be formed using, e.g., a chemical vapor deposition process or an atomic layer deposition process.

Figure 13:
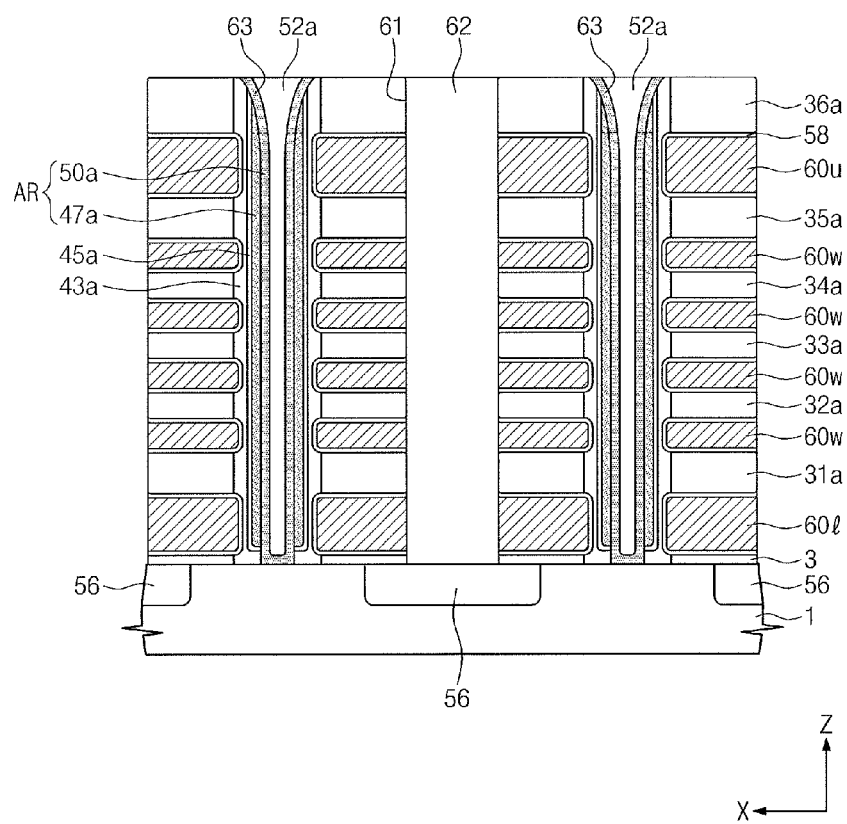

Referring to FIGS. 12 and 13, a gate layer (not illustrated) may be formed to fill the second opening 54 and the gate formation region 55. The gate layer may include, e.g., polysilicon doped with an impurity and/or a metal containing layer. A planarization etching process may be performed to remove portions of the gate layer and the blocking insulating layer 59 on a top surface of the sixth gate interlayer pattern 36a, thereby exposing the top surface of the sixth gate interlayer pattern 36a. Portions of the gate layer in the second opening 54 may be removed to form the gate patterns 60l, 60w, and 60u and a third opening 61 overlapping the second opening 54. Portions of the gate patterns 60l, 60w, and 60u adjacent to the active pillar AR may have rounded corners embedded in the auxiliary insulating pattern 43a. A buried insulating pattern 62 may be formed in the third opening 61. An ion implantation process may be performed to form a second impurity implantation region 63 on an upper portion of the active pillar AR.

Referring to FIG. 3A, a conductive layer (not illustrated) may be formed on the sixth inter-gate dielectric pattern 36a.

The conductive layer may be patterned to form a conductive line 64 contacting the second impurity implantation region 63 and extending along the first direction X. Although not illustrated in the drawing, a process of forming an interconnection to apply an electrical signal to the word line gate patterns 60w may be added. At this time, the word line gate patterns 60w located on one X-Z plane may be connected to one another in common.

Figure 14:
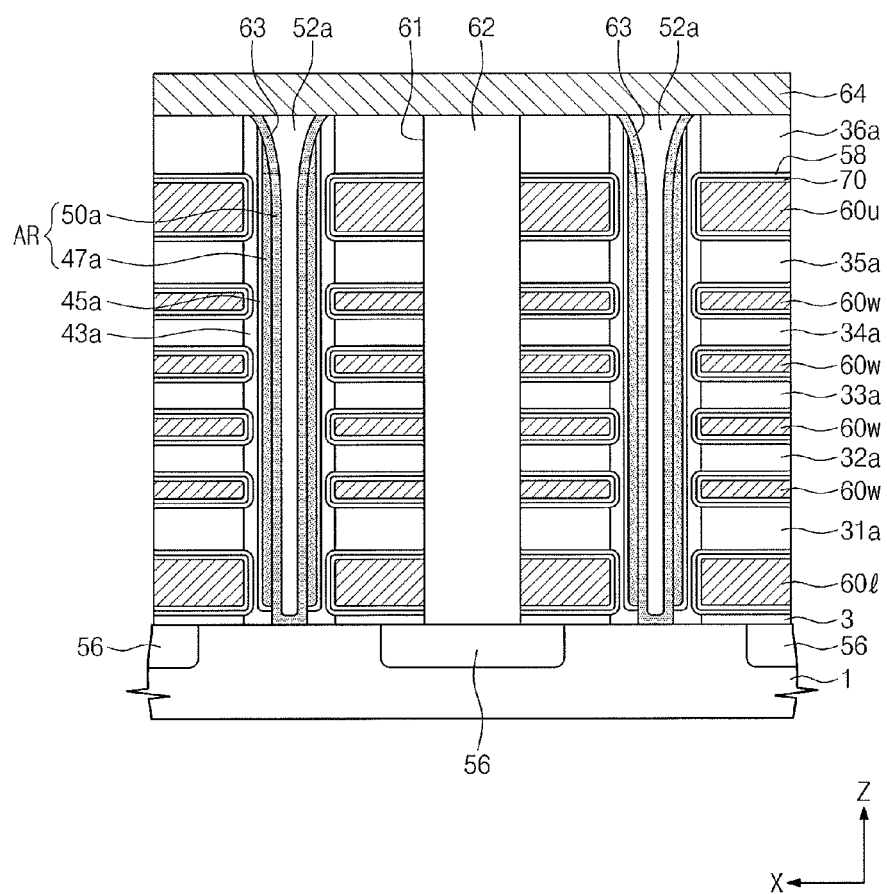
FIG. 14 illustrates a cross sectional view taken along the line I-I' of FIG. 2 showing a nonvolatile memory device according to another embodiment.

FIG. 14 illustrates a cross sectional view taken along the line I-I' of FIG. 2 showing a nonvolatile memory device according to another embodiment.

Referring to FIG. 14, in a nonvolatile memory device in accordance with the present embodiment, a first blocking insulating layer 58 and a second blocking insulating layer 70 may be interposed between the gate patterns 60l, 60w, and 60u and the inter-gate dielectric patterns 31a, 32a, 33a, 34a, 35a, and 36a and between the gate patterns 60l, 60w, and 60u and the auxiliary insulating pattern 43a. The blocking insulating layers 58 and 70 may be formed of the same material as each other or different materials from each other. The blocking insulating layers 58 and 70 may include, e.g., a silicon oxide layer and/or a high dielectric layer. The structure and formation method may be identical to or similar to the previous embodiment except for the details described above.

Figure 15:
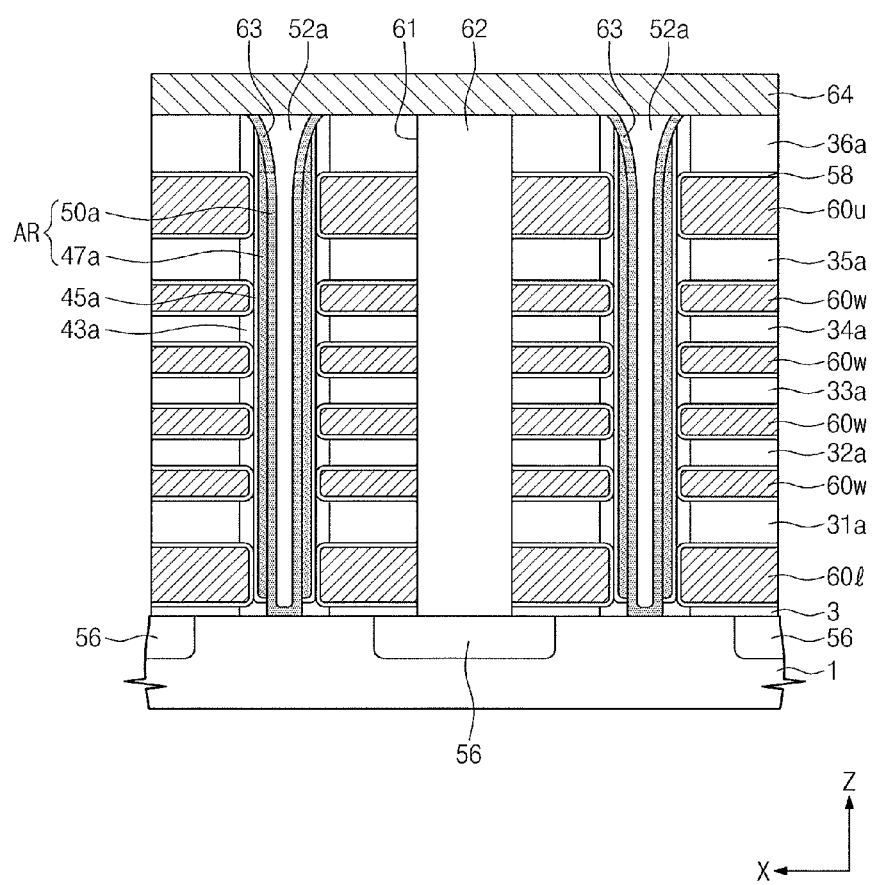
FIG. 15 illustrates a cross sectional view taken along the line I-I' of FIG. 2 showing a nonvolatile memory device according to yet another embodiment.

FIG. 15 illustrates a cross sectional view taken along the line I-I' of FIG. 2 showing a nonvolatile memory device according to yet another embodiment.

Referring to FIG. 15, in a nonvolatile memory device in accordance with the present embodiment, the blocking insulating layer 58 may penetrate, e.g., completely penetrate, the auxiliary insulating pattern 43a to contact the gate insulating layer pattern 45a. Thus, the auxiliary insulating layer 43a may not be interposed between the blocking insulating layer 58 and the gate insulating layer 45a. The structure and formation method may be identical to or similar to the previous embodiment except the details described above.

A process of forming a nonvolatile memory device having a cross section of FIG. 15 is described with reference to FIG. 16. For example, FIG. 16 illustrates a cross sectional view of stages in a process of forming the nonvolatile memory device of FIG. 15.

Figure 16:
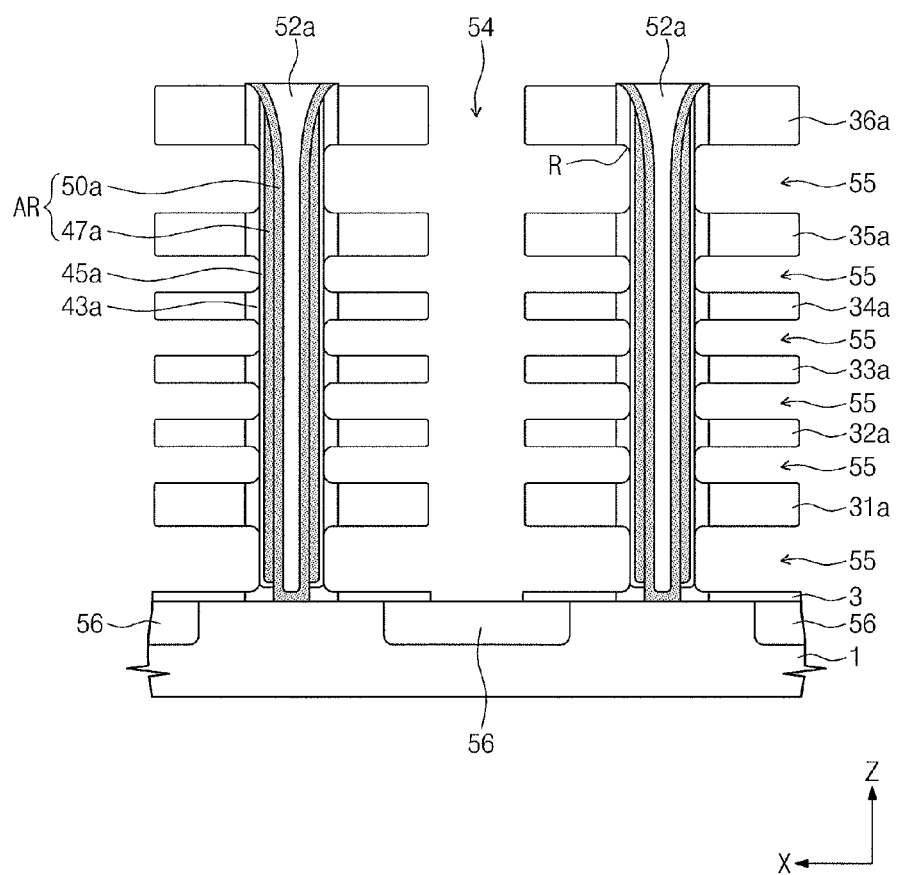
FIG. 16 illustrates a cross sectional view of stages in a process of forming the nonvolatile memory device of FIG. 15.

Referring to FIG. 16, after forming the gate formation region 55 by selectively removing the sacrificial layers 21, 22, 23, 24, 25, and 26 exposed through the second opening 54, as illustrated in FIG. 10, an isotropic process may be performed to remove a part of sidewall of the exposed auxiliary insulating pattern 43a. At this time, a sidewall of the gate insulating layer pattern 45a may be exposed and a rounded profile R may be formed on a sidewall of the auxiliary insulating pattern 43a. A subsequent process may be identical to or similar to the previous embodiments.

Figure 17:
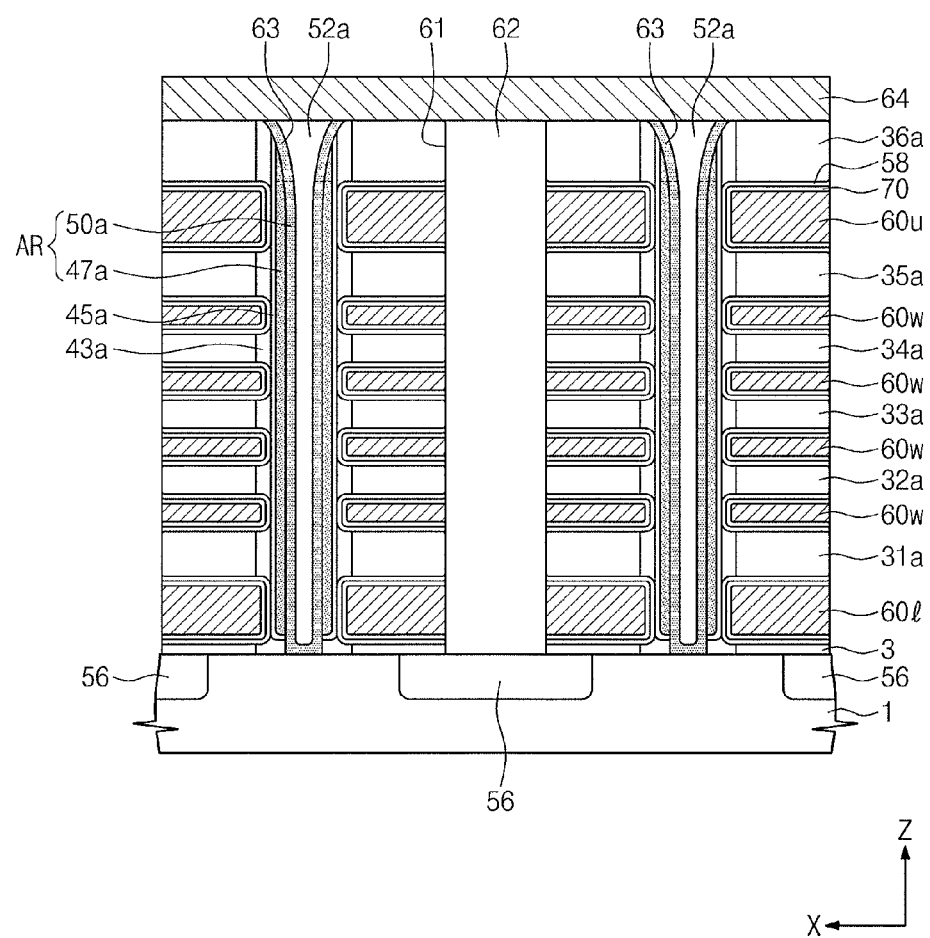
FIG. 17 illustrates a cross sectional view taken along the line I-I' of FIG. 2 showing a nonvolatile memory device according to still another embodiment.

FIG. 17 illustrates a cross sectional view taken along the line of FIG. 2 showing a nonvolatile memory device according to still another embodiment.

Referring to FIG. 17, in a nonvolatile memory device in accordance with the present embodiment, a first blocking insulating layer 58 and a second blocking insulating layer 70 may be interposed between the gate patterns 60l, 60w, and 60u and the inter-gate dielectric patterns 31a, 32a, 33a, 34a, 35a, and 36a and between the gate patterns 60l, 60w, and 60u and the gate insulating layer pattern 45a. The blocking insulating layers 58 and 70 may be formed of the same material as each other or different materials from each other. The blocking insulating layers 58 and 70 may include, e.g., a silicon oxide layer and/or a high dielectric layer. The structure and formation method may be identical to or similar to the previous embodiments except for the details described above.

Figure 18:
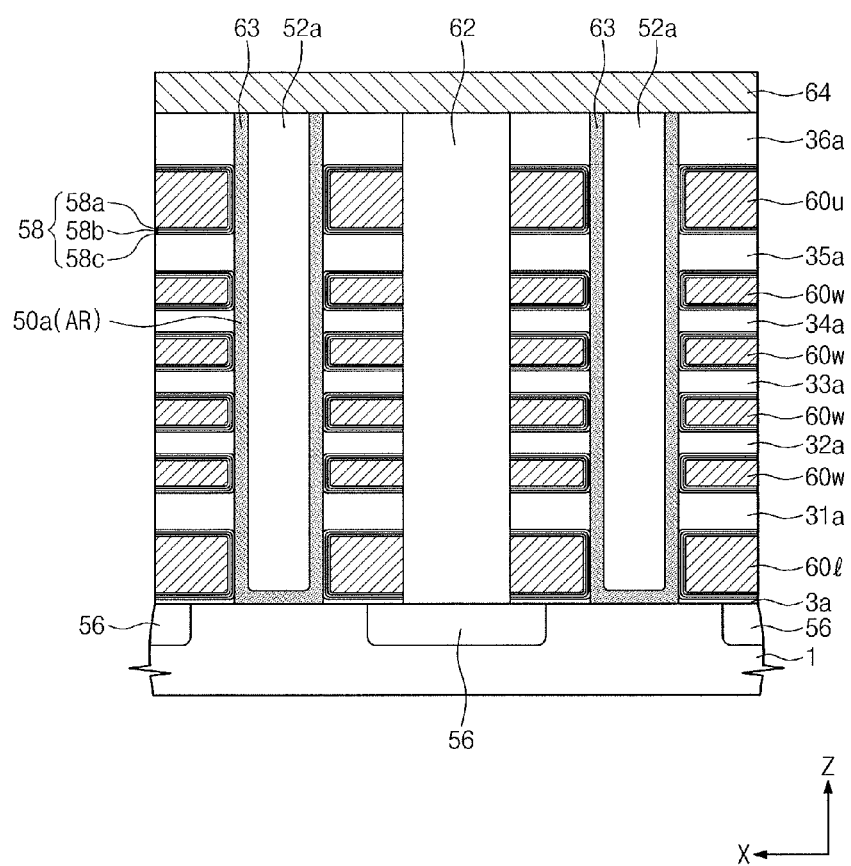
FIG. 18 illustrates a cross sectional view taken along the line I-I' of FIG. 2 showing a nonvolatile memory device according to still another embodiment.

FIG. 18 illustrates a cross sectional view taken along the line I-I' of FIG. 2 showing a nonvolatile memory device according to still another embodiment.

Referring to FIG. 18, in a nonvolatile memory device in accordance with the present embodiment, the active pillar AR may be constituted by one semiconductor pattern 50a. For example, an auxiliary insulating pattern may not be included between the active pillar AR and the gate patterns 60l, 60w, and 60u. Also, a gate insulating layer and an auxiliary insulating pattern may not be included between the active pillar AR and the inter-gate dielectric patterns 31a, 32a, 33a, 34a, 35a, and 36a. In the present embodiment, the blocking (gate) insulating layer 58 may include a tunnel insulating layer 58a, a charge trap layer 58b, and a blocking insulating layer 58c and may be interposed between the active pillar AR and the gate patterns 60l, 60w, and 60u and between the gate patterns 60l, 60w, and 60u and the inter-gate dielectric patterns 31a, 32a, 33a, 34a, 35a, and 36a. Corners of the gate patterns 60l, 60w, and 60u adjacent to the active pillar AR may be rounded. The structure may be identical to or similar to the previous embodiments except for the details described above.

FIGS. 19 through 23 illustrate cross sectional views of stages in a process of forming the nonvolatile memory device of FIG. 18.

Figure 19:
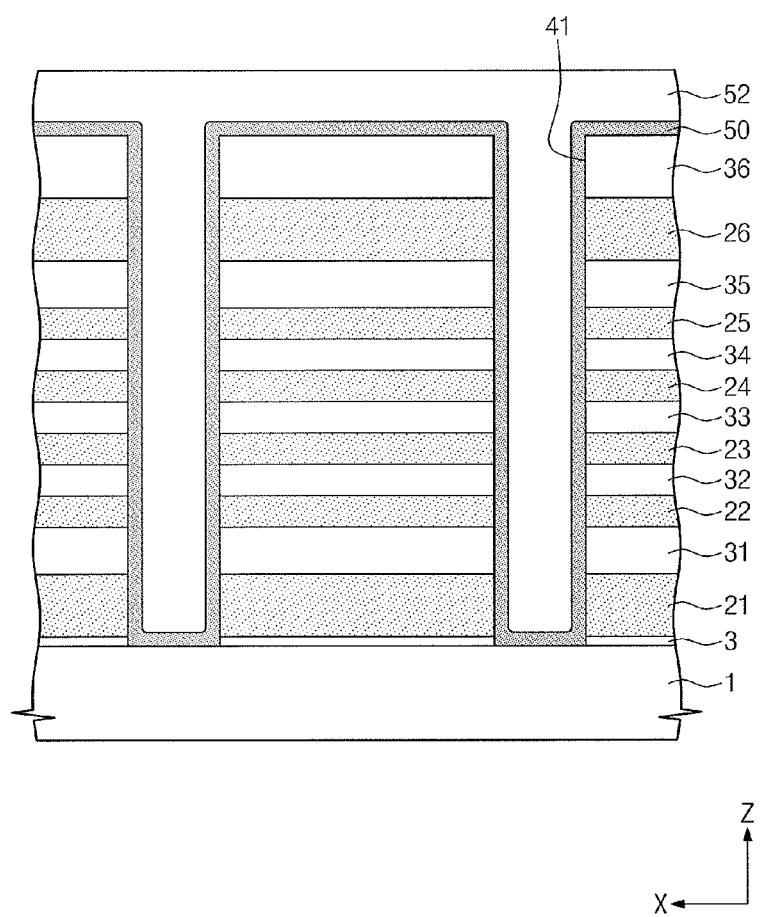
FIGS. 19 through 23 illustrate cross sectional views of stages in a process of forming the nonvolatile memory device of FIG. 18.

Referring to FIG. 19, a buffer layer 3 may be formed on a semiconductor substrate 1. The buffer layer 3 may be formed as, e.g., a silicon oxide layer system. Sacrificial layers 21, 22, 23, 24, 25, and 26 and inter-gate dielectric layers 31, 32, 33, 34, 35, and 36 may be alternately stacked on the buffer layer 3. The sacrificial layers 21, 22, 23, 24, 25, and 26, the inter-gate dielectric layers 31, 32, 33, 34, 35, and 36, and the buffer layer 3 may be anisotropically etched to form a plurality of openings 41 exposing the semiconductor substrate 1. A semiconductor layer 50 may be conformally formed on the semiconductor substrate 1 including the first opening 41. The semiconductor layer 50 may include, e.g., a polysilicon layer not doped with an impurity. An internal insulating layer 52 may be formed to fill the first opening 41. The internal insulating layer 52 may be formed as, e.g., a silicon oxide layer system.

Figure 20:
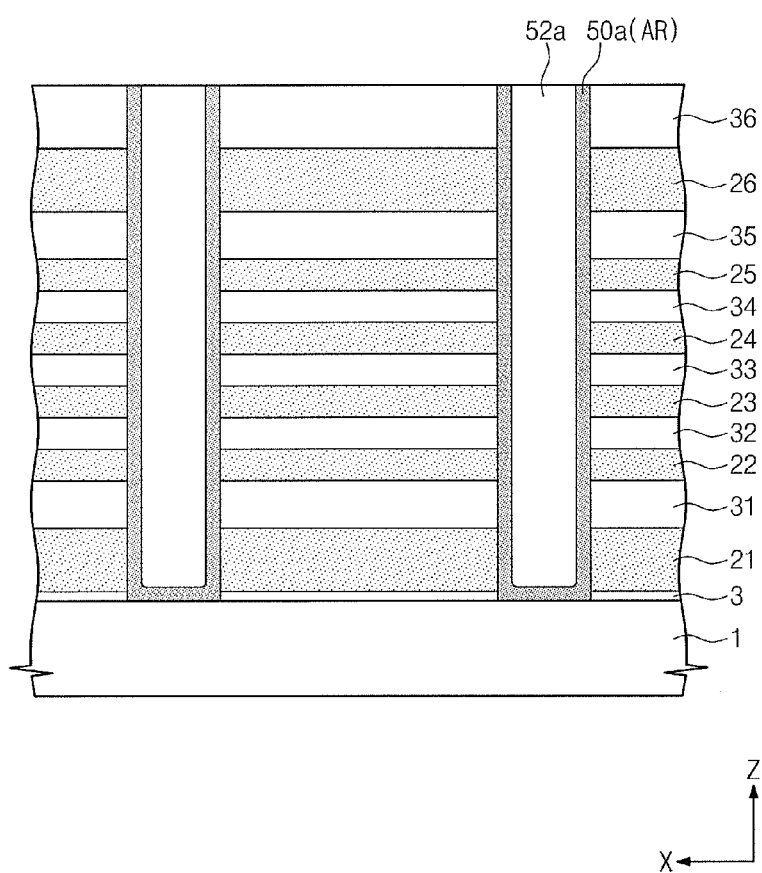

Referring to FIG. 20, a planarization process may be performed to expose a top surface of the sixth gate interlayer layer 36 while forming a semiconductor pattern 50a and an internal insulating pattern 52a in the first opening 41. As a result, an active pillar AR constituted by the semiconductor pattern 50a may be formed.

Figure 21:
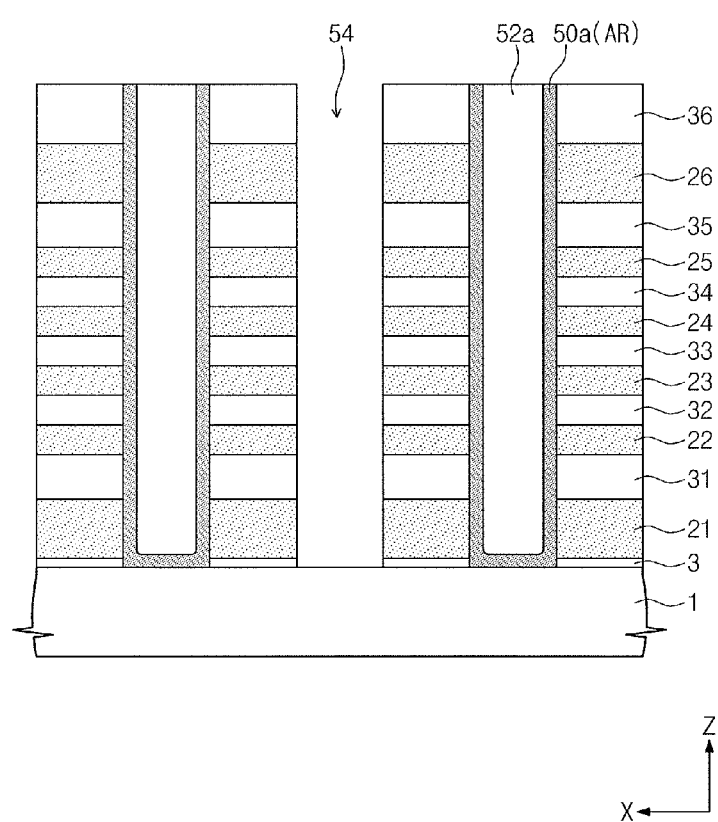

Referring to FIG. 21, portions of the sacrificial layers 21, 22, 23, 24, 25, and 26, the inter-gate dielectric layers 31, 32, 33, 34, 35, and 36, and the buffer layer 3 between the two adjacent active pillars AR may be anisotropically etched to form a second opening 54 exposing a top surface of the semiconductor substrate 1. The second opening 54 may have a line shape on a plane formed by the first direction X and the second direction Y. An ion implantation process may be performed to form a first impurity region 56 (see FIG. 22) in the semiconductor substrate 1 exposed through the second opening 54.

Figure 22:
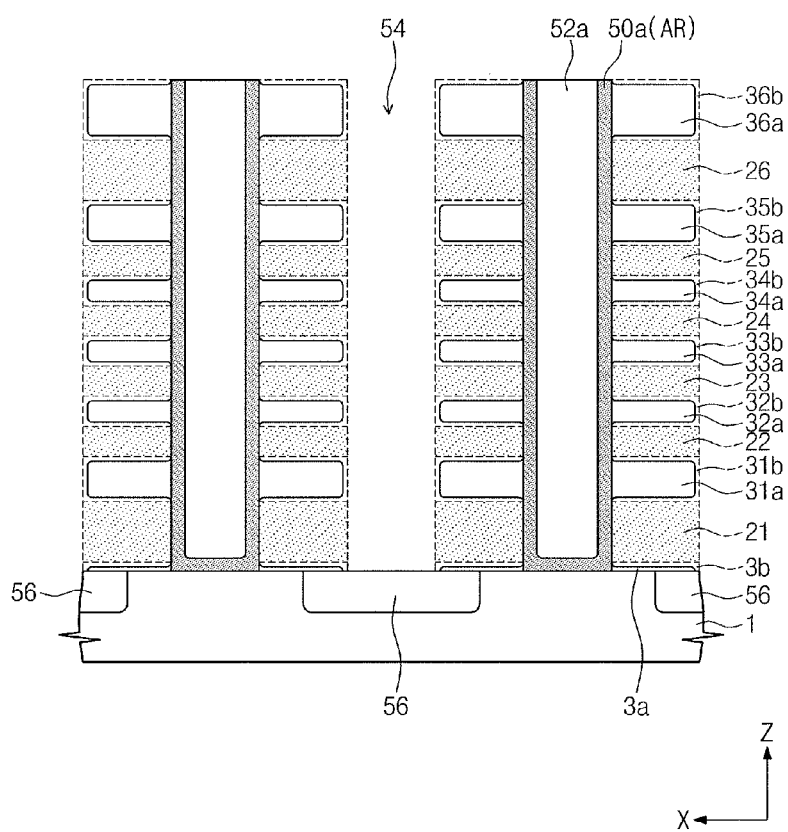
Figure 23:
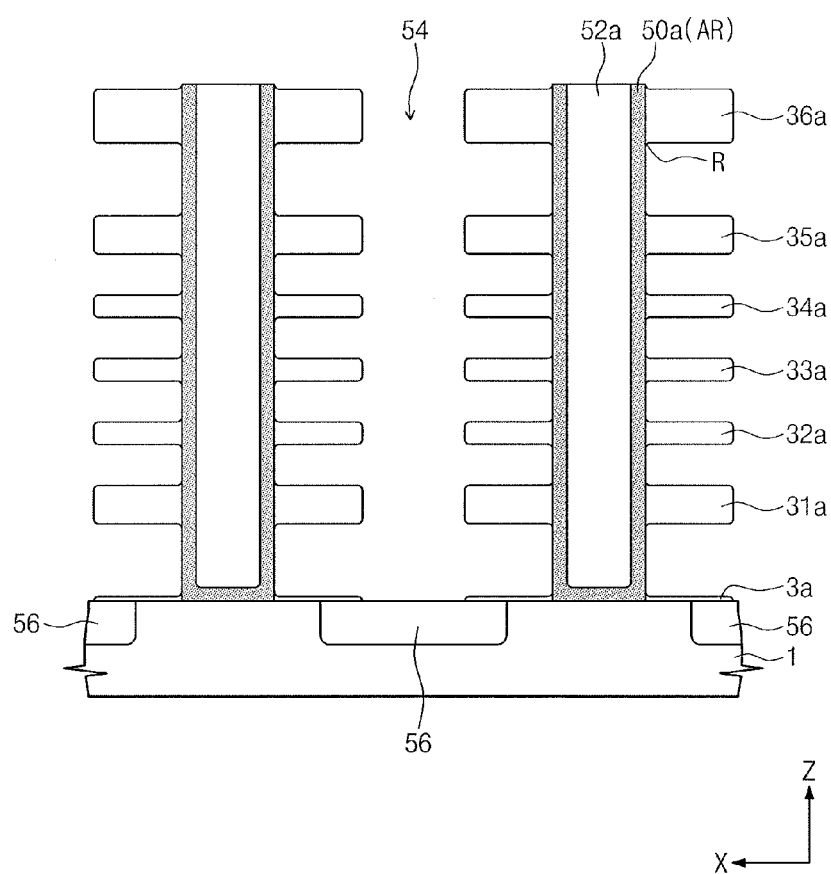

Referring to FIGS. 22 and 23, an isotropic etching process may be performed to remove the sacrificial layers 21, 22, 23, 24, 25, and 26 exposed through the second opening 54 and also removing a portion of the inter-gate dielectric layers 31, 32, 33, 34, 35, and 36. The isotropic etching process may be performed using an etching recipe or etchant having an etching selectivity ratio such that an etch rate of the inter-gate dielectric layers (reference number: 31, 32, 33, 34, 35, and 36) to an etch rate of the sacrificial layers (reference number: 21, 22, 23, 24, 25, and 26) is about 1:5 to about 1:15. In an implementation, the ratio of the etch rates may be about 1:10. The etchant may include, e.g., water and phosphoric acid. As a result, the sacrificial layers 21, 22, 23, 24, 25, and 26 and edge portions of the inter-gate dielectric layers 31, 32, 33, 34, 35, and 36 (indicated by a dotted line) may be removed, and inter-gate dielectric patterns 31a, 32a, 33a, 34a, 35a, and 36a may remain. At this time, a part (3b) of the buffer layer 3 may be removed and another part (3a) of the buffer layer 3 may remain. Corners of the inter-gate dielectric layers 31, 32, 33, 34, 35, and 36 adjacent to the second opening 54 may be removed to a greater degree, and other parts of the inter-gate dielectric layers 31, 32, 33, 34, 35, and 36 (e.g., adjacent to the active pillar AR) may be removed to a lesser degree because the etchant may not readily contact some parts of the inter-gate dielectric layers 31, 32, 33, 34, 35, and 36. As illustrated in FIG. 23, upper and lower portions of the inter-gate dielectric patterns 31a, 32a, 33a, 34a, 35a, and 36a (which contact the active pillar AR) may be formed to have a rounded profile R.

Referring back to FIG. 18, the blocking (gate) insulating layer 58 may be conformally formed. The nonvolatile memory device of FIG. 18 may be formed by applying the subsequent processes disclosed in the previous embodiments.

Figure 24:
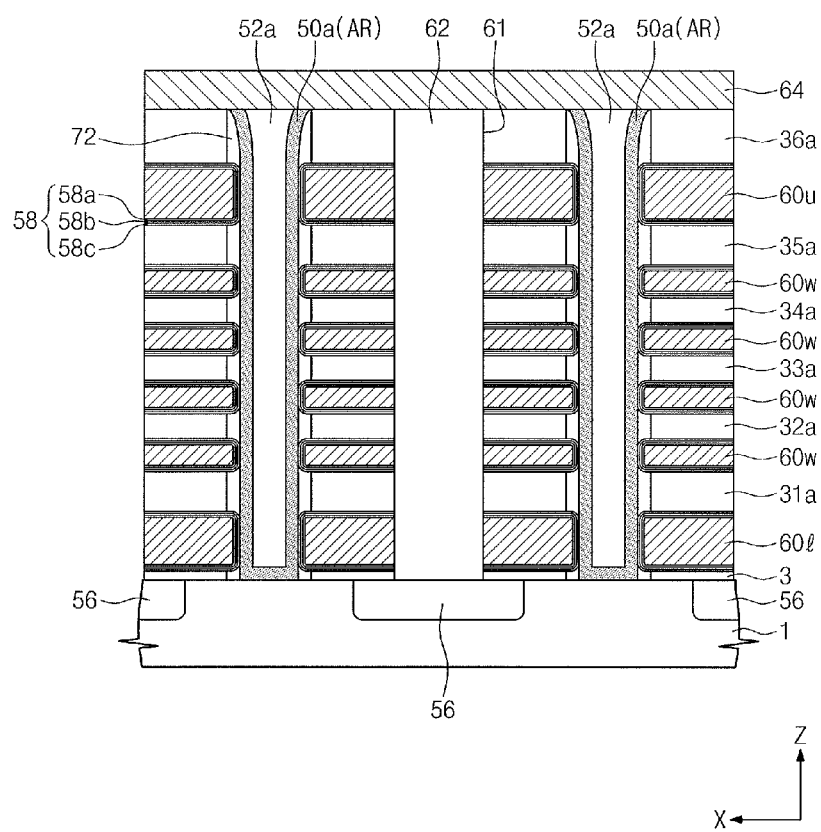
FIG. 24 illustrates a cross sectional view taken along the line I-I' of FIG. 2 showing a nonvolatile memory device according to still another embodiment.

FIG. 24 illustrates a cross sectional view taken along the line I-I' of FIG. 2 showing a nonvolatile memory device according to still another embodiment.

Referring to FIG. 24, in a nonvolatile memory device in accordance with the present embodiment, an active pillar AR may be constituted by one semiconductor pattern 50a. An auxiliary insulating pattern 72 may not be included between the active pillar AR and the gate patterns 60l, 60w, and 60u. However, the auxiliary insulating pattern 72 may be included between the active pillar AR and the inter-gate dielectric patterns 31a, 32a, 33a, 34a, 35a, and 36a. In the present embodiment, the auxiliary insulating pattern 72 may be formed of a material having an etching selectivity with respect to the inter-gate dielectric patterns 31a, 32a, 33a, 34a, 35a, and 36a. In an implementation, the auxiliary insulating pattern 72 may be formed of, e.g., a silicon oxide layer, phosphorous doped silicate glass (PSG), boron phosphorous silicate glass (BPSG), and/or a silicon germanium, that are doped with an impurity such as boron or phosphorous. The blocking (gate) insulating layer 58 may include a tunnel insulating layer 58a, a charge trap layer 58b, and a blocking insulating layer 58c and may be interposed between the active pillar AR and the gate patterns 60l, 60w, and 60u and between the inter-gate dielectric patterns 31a, 32a, 33a, 34a, 35a, and 36a and the gate patterns 60l, 60w, and 60u. Corners of the gate patterns 60l, 60w, and 60u (adjacent to the active pillar AR) may be rounded. In an implementation, a distance between the internal insulating pattern 52a and an outer edge of the auxiliary insulting pattern 72 may be greater than a distance between the internal insulating pattern and the rounded corners of the gate patterns 60l, 60w, and 60u. The round corners of the gate patterns 60l, 60w, and 60u may vertically overlap the auxiliary insulating pattern 72. For example, ends of the gate patterns 60l, 60w, and 60u including the rounded corners may completely penetrate the auxiliary insulating pattern 72. The structure may be identical to similar to the previous embodiments except for the details described above.

FIGS. 25 through 28 illustrate cross sectional views of stages in a process of forming the nonvolatile memory device of FIG. 24.

Figure 25:
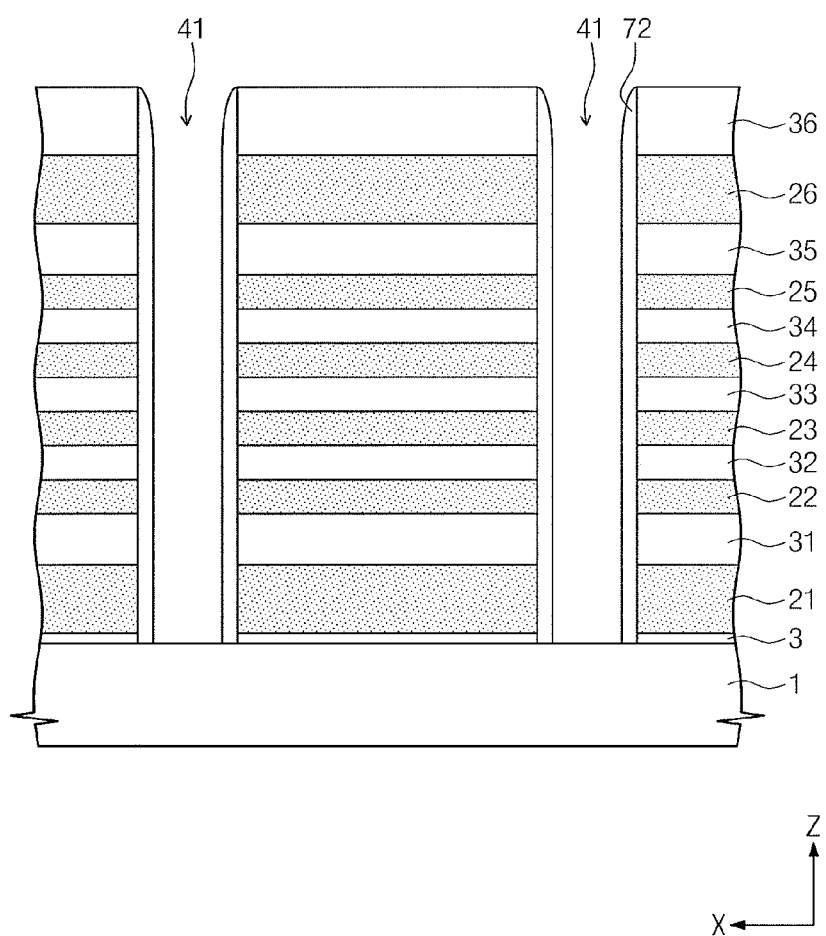
FIGS. 25 through 28 illustrate cross sectional views of stages in a process of forming the nonvolatile memory device of FIG. 24.

Referring to FIG. 25, a buffer layer 3 may be formed on a semiconductor substrate 1. The buffer layer 3 may include, e.g., a silicon oxide layer system. Sacrificial layers 21, 22, 23, 24, 25, and 26 and inter-gate dielectric layers 31, 32, 33, 34, 35, and 36 may be alternately stacked on the buffer layer 3. The sacrificial layers 21, 22, 23, 24, 25, and 26, the inter-gate dielectric layers 31, 32, 33, 34, 35, and 36, and the buffer layer 3 may be anisotropically etched to form a plurality of openings 41 exposing portions of the semiconductor substrate 1. An auxiliary insulating layer (not illustrated) may be conformally formed on the semiconductor substrate 1 including the first opening 41. The auxiliary insulating layer may be formed of, e.g., a silicon oxide layer, phosphorous doped silicate glass (PSG), boron phosphorous silicate glass (BPSG), and/or a silicon germanium, that are doped with an impurity such as boron or phosphorous. An anisotropic etching process may be performed on the auxiliary insulating layer to remove portions of the auxiliary insulating layer on the sixth gate interlayer layer 36 and may form an auxiliary insulating pattern 72 covering an inner sidewall of the first opening 41. At this time, a top surface of the semiconductor substrate 1 in the first opening 41 may be exposed.

Figure 26:
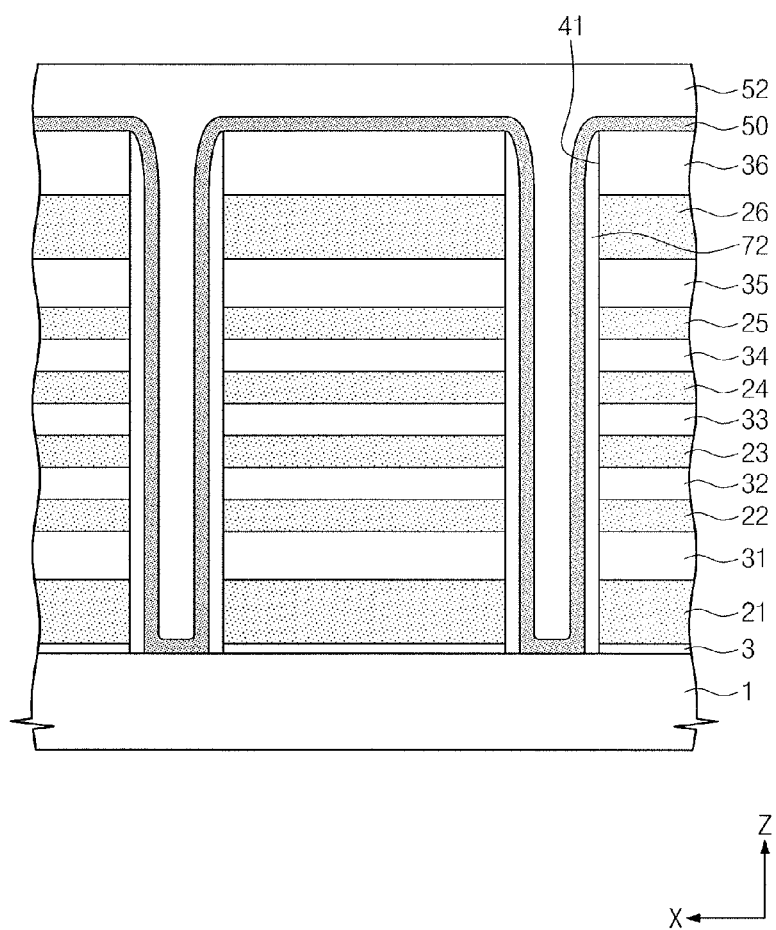

Referring to FIG. 26, a semiconductor layer 50 may be conformally formed on the semiconductor substrate 1 including the auxiliary insulating pattern 72. An internal insulating layer 52 may be formed to fill other portions of the first opening 41. The internal insulating layer 52 may be formed as, e.g., a silicon oxide layer system.

Figure 27:
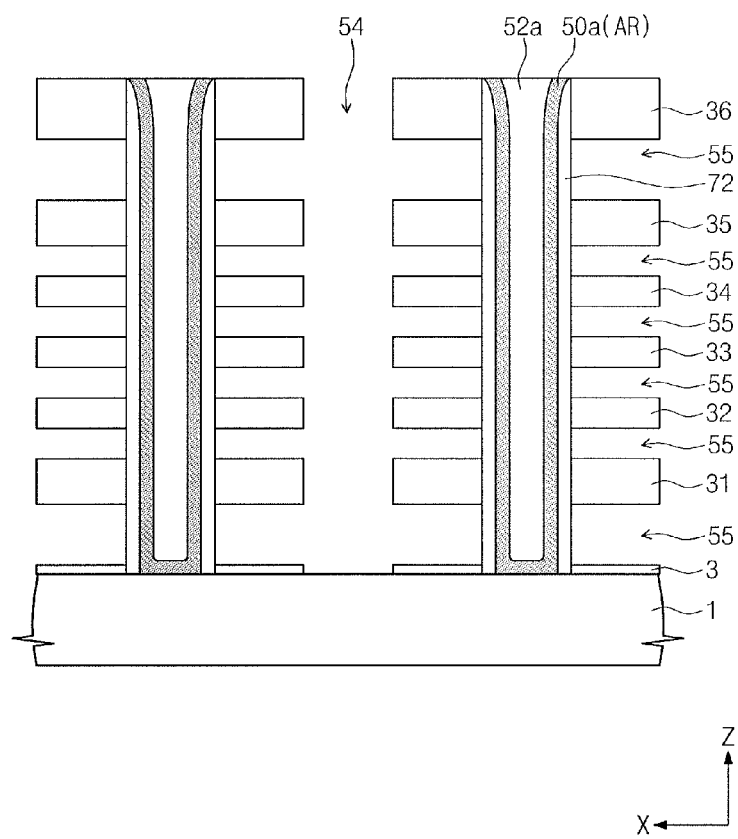

Referring to FIGS. 26 and 27, a planarization process may be performed to expose a top surface of the sixth gate interlayer layer 36 while forming a semiconductor pattern 50a and an internal insulating pattern 52a in the first opening 41. As a result, an active pillar AR (constituted by the second semiconductor pattern 50a) may be formed. An anisotropic etching process may be successively performed on the inter-gate dielectric layers 31, 32, 33, 34, 35, and 36, the sacrificial layers 21, 22, 23, 24, 25, and 26, and the buffer layer 3 between the adjacent two active pillars AR to form a second opening 54 exposing a top surface of the semiconductor substrate 1. The second opening 54 may have a line shape on a plane formed by the first direction X and the second direction Y. An ion implantation process may be performed to form a first impurity implantation region (not illustrated) in a portion of the semiconductor substrate 1 exposed through the second opening 54. A first isotropic etching process may be performed to selectively remove the sacrificial layers 21, 22, 23, 24, 25, and 26 exposed through the second opening 54. The first isotropic etching process may be performed using an etching recipe or etchant having an etching selectivity ratio such that an etch rate of the inter-gate dielectric layers (reference number: 31, 32, 33, 34, 35, and 36) to an etch rate of the sacrificial layers (reference number: 21, 22, 23, 24, 25, and 26) is about 1:30 or more. As a result, a sidewall of the auxiliary insulating pattern 72 and top and bottom surfaces of the inter-gate dielectric layers 31, 32, 33, 34, 35, and 36 may be exposed.

Figure 28:
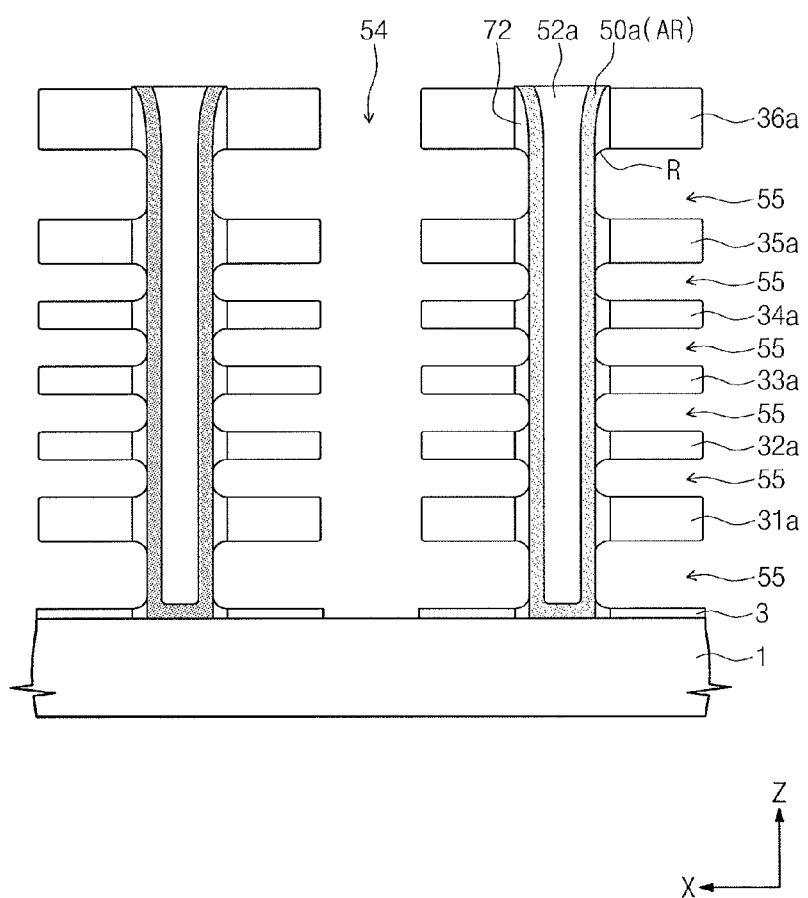

Referring to FIG. 28, a second isotropic etching process may be performed to remove a part of the exposed auxiliary insulating pattern 72. The second isotropic etching process may be performed using an etching recipe or etchant having an etching selectivity ratio such that an etch rate of the inter-gate dielectric layers (reference number: 31, 32, 33, 34, 35, and 36) to an etch rate of the sacrificial layers (reference number: 21, 22, 23, 24, 25, and 26) is about 1:5 to about 1:15. In an implementation, the etch rate ratio may be about 1:10. As a result, a sidewall of the active pillar AR may be exposed, and a rounded profile R may be formed in the auxiliary insulating pattern 72. Also, the inter-gate dielectric patterns 31a, 32a, 33a, 34a, 35a, and 36a may be formed.

Referring back to FIG. 24, a blocking (gate) insulating layer 58 may be conformally formed. The nonvolatile memory device of FIG. 24 may be formed by applying subsequent processes disclosed in the previous embodiments.

Figure 29:
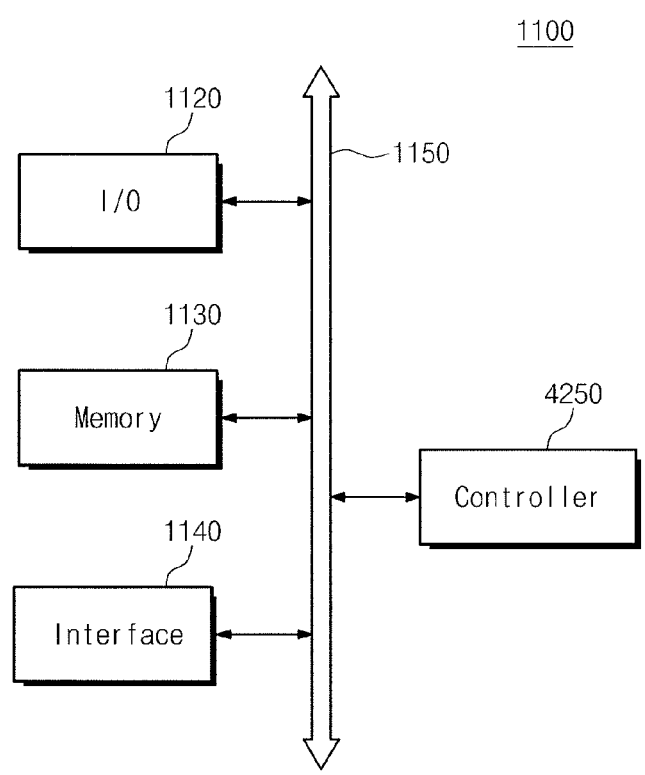
FIG. 29 illustrates a block diagram of a memory system including a vertical type nonvolatile memory device in accordance with an embodiment.

FIG. 29 illustrates a block diagram of a memory system including a vertical type nonvolatile memory device in accordance with an embodiment.

Referring to FIG. 29, a memory system 1100 may be applied to a PDA (personal digital assistant), a portable computer, a web tablet, a wireless phone, a mobile phone, a digital music player, a memory card, and/or all the devices that can transmit and/or receive data in a wireless communication environment.

The memory system 1100 may include a controller 1110, an input/output device 1120 such as a keypad and a displayer, a memory 1130, an interface 1140 and a bus 1150. The memory 1130 and the interface 1140 may communicate with each other through the bus 1150.

The controller 1110 may include at least one microprocessor, at least one digital signal processor, at least one micro controller, or other process devices similar to those described above. The memory 1130 may be used to store an instruction executed by the controller 1110. The input/output device 1120 may receive data or a signal from outside of the system 1100 or transmit data or a signal to the outside of the system 1100. For example, the input/output device 1120 may include a keyboard, a keypad, and/or a display device.

The memory 1130 may include a nonvolatile memory device in accordance with an embodiment. The memory 1130 may further include a different kind of memory, a random access volatile memory device, and/or various kinds of memories.

The interface 1140 may transmit data to a communication network or receive data from a communication network.

Figure 30:
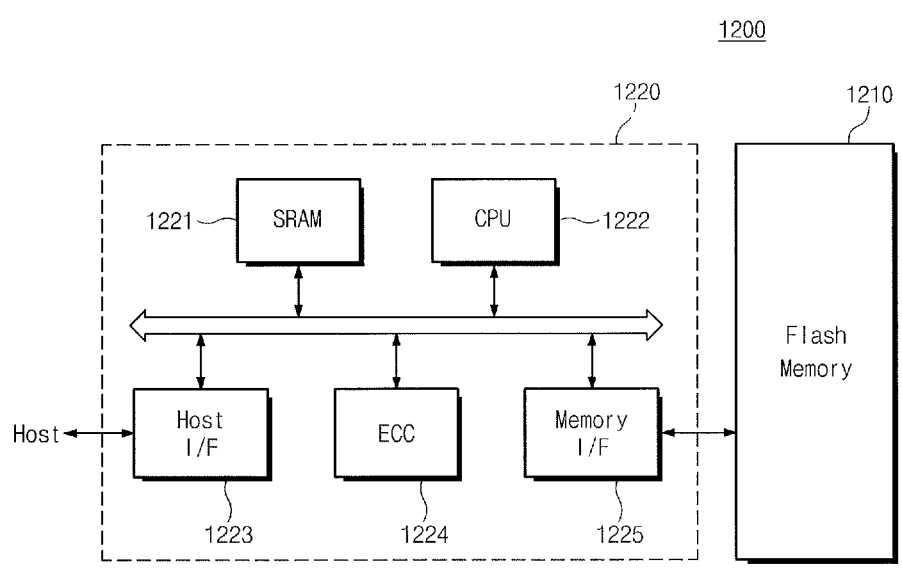
FIG. 30 illustrates a block diagram of a memory card including a vertical type nonvolatile memory device in accordance with an embodiment.

FIG. 30 illustrates a block diagram of a memory card including a vertical type nonvolatile memory device in accordance with an embodiment.

Referring to FIG. 30, the memory card 1200 for supporting a data storage capability of a large capacity may be fitted with a flash memory device 1210 in accordance with an embodiment. The memory card 1200 in accordance with an embodiment may include a memory controller 1220 controlling the whole data exchange between a host and the flash memory device 1210.

A SRAM 1221 may be used as an operation memory of a processing unit 1222. A host interface 1223 may include data exchange protocols of the host connected to the memory card 1200. An error correction block 1224 may detect and correct errors included in data readout from a multi bit flash memory device 1210. A memory interface 1225 may interface with the flash memory device 1210 of the embodiment. A processing unit 1222 may perform whole control operation for a data exchange of the memory controller 1220. Although not illustrated in the drawing, the memory card 1200 according to an embodiment may further include a ROM (not shown) storing code data for interfacing with the host.

According to the flash memory device and the memory card or the memory system, a memory system having high reliability may be provided through the flash memory device 1210 in which an erasure characteristic of dummy cells is improved. For example, the flash memory device of an embodiment may be provided to a memory system such as a solid state disk (SSD). In this case, a memory system having high reliability may be embodied by blocking read errors caused by dummy cells.

Figure 31:
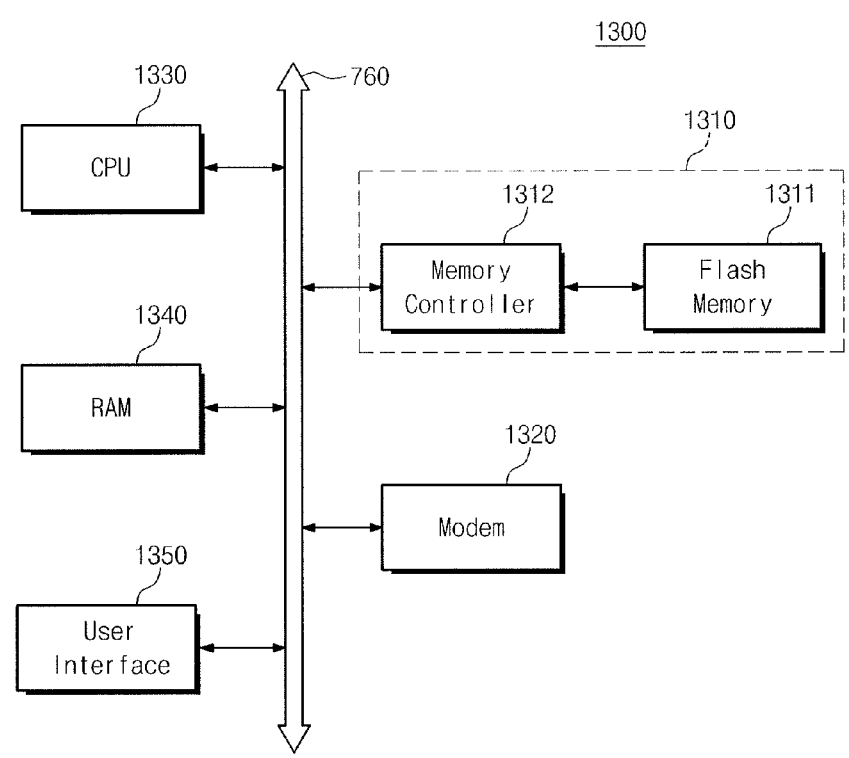
FIG. 31 illustrates a block diagram of an information processing system including a vertical type nonvolatile memory device in accordance with an embodiment.

FIG. 31 illustrates a block diagram of an information processing system including a vertical type nonvolatile memory device in accordance with an embodiment.

Referring to FIG. 31, a flash memory system 1310 of an embodiment may be built in a data processing system such as a mobile instrument or a desk top computer. A data processing system 1300 in accordance with an embodiment may include the flash memory system 1310 and a modem 1320, a central processing unit (CPU) 1330, a random access memory (RAM) 1340, and a user interface 1350 that are electrically connected to a system bus 1360 respectively. The flash memory system 1310 may be constituted to be the same with the memory system or the flash memory system described above. The flash memory system 1310 may store data processed by the central processing unit 1330 or data received from an external device. Here, the flash memory system 1310 may be constituted by a solid state disk (SSD) and in this case, the data processing system 1310 may stably store large amounts of data in the flash memory system 1310. As reliability increases, the flash memory system 1310 may reduce resources being used to correct errors, thereby providing a high speed data exchange function to the data processing system 1300. Although not illustrated in the drawing, the data processing unit 1300 in accordance with an embodiment may further include an application chipset, a camera image processor (CIS), and/or an input/output device.

The flash memory device or the memory system in accordance with the embodiments may be mounted by various types of packages. For example, the flash memory device or the memory system may be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP) and mounted.

In a nonvolatile memory device in accordance with an embodiment, corners of gate patterns adjacent to an active pillar may be rounded. Thus, an electric field may be prevented from being concentrated on a corner of the gate pattern. Accordingly, reliability of the gate insulating layer may increase, and a back tunneling phenomenon (that may occur when an erasure operation is performed) may be reduced or prevented. As a result, a nonvolatile memory device having improved reliability may be embodied.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a nonvolatile memory device, the method comprising:

providing a semiconductor substrate;
repeatedly and alternately stacking sacrificial layers and inter-gate dielectric layers on the semiconductor substrate;
forming an active pillar that penetrates the inter-gate dielectric layers and the sacrificial layers to contact the semiconductor substrate;
patterning the inter-gate dielectric layers and the sacrificial layers at a position spaced from the active pillar to form a first opening;
removing the sacrificial layers through the first opening; and
forming a gate pattern on a region where the sacrificial layers are removed, wherein a corner of the gate pattern adjacent to the active pillar is formed to be rounded,
wherein forming the active pillar includes:
   patterning the inter-gate dielectric layers and the sacrificial layers to form a second opening;
   conformally forming an auxiliary insulating layer, a gate insulating layer and a first semiconductor layer on the semiconductor substrate where the second opening is formed;
   performing an anisotropic etching process on the first semiconductor layer, the gate insulating layer, and the auxiliary insulating layer to form an auxiliary insulating pattern, a gate insulating pattern, and a first semiconductor pattern covering a sidewall of the second opening; and
   forming a second semiconductor layer covering the semiconductor substrate exposed through the second opening and a sidewall of the first semiconductor pattern, and
wherein the second semiconductor layer and the first semiconductor pattern constitute the active pillar.

2. The method as claimed in claim 1, wherein:
removing the sacrificial layers through the first opening includes exposing the auxiliary insulating pattern using a first isotropic etching process with a first etchant, and
the method further includes forming a rounded profile on the auxiliary insulating pattern by performing a second isotropic etching process with a second etchant different from the first etchant to remove an exposed part of the auxiliary insulating pattern, prior to forming the gate pattern.

3. The method as claimed in claim 2, wherein removing the exposed part of the auxiliary insulating pattern exposes a portion of the gate insulating layer.

4. The method as claimed in claim 2, further comprising conformally forming a first blocking insulating layer after forming the rounded profile on the auxiliary insulating pattern.

5. The method as claimed in claim 1, wherein removing the sacrificial layers through the first opening includes forming a rounded profile on a sidewall of the inter-gate dielectric layer by removing a part of the inter-gate dielectric layer.

6. The method as claimed in claim 5, wherein:
removing the sacrificial layers includes performing an isotropic etching process, and
the isotropic etching process is performed using an etchant having an etching selectivity ratio such that an etch rate of the inter-gate dielectric layer to an etch rate of the sacrificial layer is about 1:5 to about 1:15.

7. A method of forming a nonvolatile memory device, the method comprising:
providing a semiconductor substrate;
alternately stacking a plurality of sacrificial layers and inter-gate dielectric layers on the semiconductor substrate;
forming an insulating pattern and an active pillar such that the active pillar penetrates the stacked inter-gate dielectric layers and the sacrificial layers to contact the semiconductor substrate and such that the insulating pattern is between the active pillar and the stacked inter-gate dielectric layers and the sacrificial layers;
patterning the inter-gate dielectric layers and the sacrificial layers at a position spaced from the active pillar to form a first opening;
removing the sacrificial layers through the first opening to form inter-gate dielectric patterns;
etching the insulating pattern such that indentations having rounded corners at least partially penetrate therethrough; and
forming a gate pattern between the inter-gate dielectric patterns and in the indentations such that portions of the gate pattern adjacent to the active pillar have rounded corners embedded in the insulating pattern.

8. A method of forming a nonvolatile memory device, the method comprising:
providing a semiconductor substrate;
repeatedly and alternately stacking sacrificial layers and inter-gate dielectric layers on the semiconductor substrate;
forming an active pillar that penetrates the inter-gate dielectric layers and the sacrificial layers to contact the semiconductor substrate;
patterning the inter-gate dielectric layers and the sacrificial layers at a position spaced from the active pillar to form a first opening;
removing the sacrificial layers through the first opening; and
forming a gate pattern on a region where the sacrificial layers are removed, wherein a corner of the gate pattern adjacent to the active pillar is formed to be rounded,
wherein forming the active pillar includes:
   forming a second opening by patterning the inter-gate dielectric layers and the sacrificial layers;
   forming an auxiliary insulating pattern covering a sidewall of the second opening; and
   forming a semiconductor layer covering a sidewall of the auxiliary insulating pattern and the semiconductor substrate in the second opening, and
wherein the semiconductor layer constitutes the active pillar.

9. The method as claimed in claim 8, wherein:
removing the sacrificial layers through the first opening includes exposing the auxiliary insulating pattern, and
the method further includes forming a rounded profile on the auxiliary insulating pattern by performing an isotropic etching process to remove a part of the exposed auxiliary insulating pattern, prior to forming the gate pattern.

* * * * *